(12) United States Patent
Motz

(10) Patent No.: US 9,960,733 B2
(45) Date of Patent: *May 1, 2018

(54) STRESS COMPENSATED OSCILLATOR CIRCUITRY AND INTEGRATED CIRCUIT USING THE SAME

(71) Applicant: Infineon Technologies AG, Neubiberg (DE)

(72) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/227,262

(22) Filed: Aug. 3, 2016

(65) Prior Publication Data
US 2017/0331429 A1  Nov. 16, 2017

Related U.S. Application Data

(63) Continuation-in-part of application No. 15/042,276, filed on Feb. 12, 2016.

(30) Foreign Application Priority Data

Feb. 13, 2015  (DE) ........................ 10 2015 202 694

(51) Int. Cl.
*H03B 5/30* (2006.01)
*H03B 5/04* (2006.01)
(Continued)

(52) U.S. Cl.
CPC ................ *H03B 5/04* (2013.01); *G01K 3/14* (2013.01); *G01L 1/005* (2013.01); *G01L 1/18* (2013.01);
(Continued)

(58) Field of Classification Search
CPC ........... G01D 3/02; H03L 1/025; H03L 1/026; H03L 1/027; H03L 1/02; H03L 7/00;
(Continued)

(56) References Cited

U.S. PATENT DOCUMENTS 7,095,815 B2   8/2006  Kalveram et al.
9,000,833 B2   4/2015  Caffee
(Continued)

FOREIGN PATENT DOCUMENTS

DE     102006061721 A1     7/2008

*Primary Examiner* — Arnold Kinkead
(74) *Attorney, Agent, or Firm* — Harrity & Harrity, LLP

(57) ABSTRACT

A stress compensated oscillator circuitry comprises a sensor arrangement for providing a sensor output signal $S_{Sensor}$, wherein the sensor output signal $S_{Sensor}$ is based on an instantaneous stress or strain component $\sigma$ in the semiconductor substrate, a processing arrangement for processing the sensor output signal $S_{Sensor}$ and providing a control signal $S_{Control}$ depending on the instantaneous stress or strain component $\sigma$ in the semiconductor substrate, and an oscillator arrangement for providing an oscillator output signal $S_{osc}$ having an oscillator frequency $f_{osc}$ based on the control signal $S_{Control}$, wherein the control signal $S_{Control}$ controls the oscillator output signal $S_{osc}$, and wherein the control signal $S_{Control}$ reduces the influence of the instantaneous stress or strain component $\sigma$ in the semiconductor substrate onto the oscillator output signal $S_{osc}$, so that the oscillator circuitry provides a stress compensated oscillator output signal.

29 Claims, 14 Drawing Sheets

(51) Int. Cl.
*G01L 1/18* (2006.01)
*G01L 1/00* (2006.01)
*G01K 3/14* (2006.01)
*H03B 5/24* (2006.01)
*H03B 5/32* (2006.01)
*H03B 1/00* (2006.01)
*H03L 7/00* (2006.01)
*H03L 1/02* (2006.01)

(52) U.S. Cl.
CPC ............... *H03B 1/00* (2013.01); *H03B 5/24* (2013.01); *H03B 5/32* (2013.01); *H03L 1/026* (2013.01); *H03L 1/027* (2013.01); *H03L 7/00* (2013.01)

(58) Field of Classification Search
CPC . H02N 1/006; H03B 5/04; H03B 5/24; H03B 5/32; H03B 1/00
USPC .................................... 331/158, 154, 116 M
See application file for complete search history.

(56) References Cited

U.S. PATENT DOCUMENTS

| | | |
|---|---|---|
| 2006/0132254 A1 | 6/2006 | Routama |
| 2008/0157850 A1* | 7/2008 | Ausserlechner ......... G01D 3/02 327/509 |
| 2016/0241186 A1 | 8/2016 | Motz |

\* cited by examiner

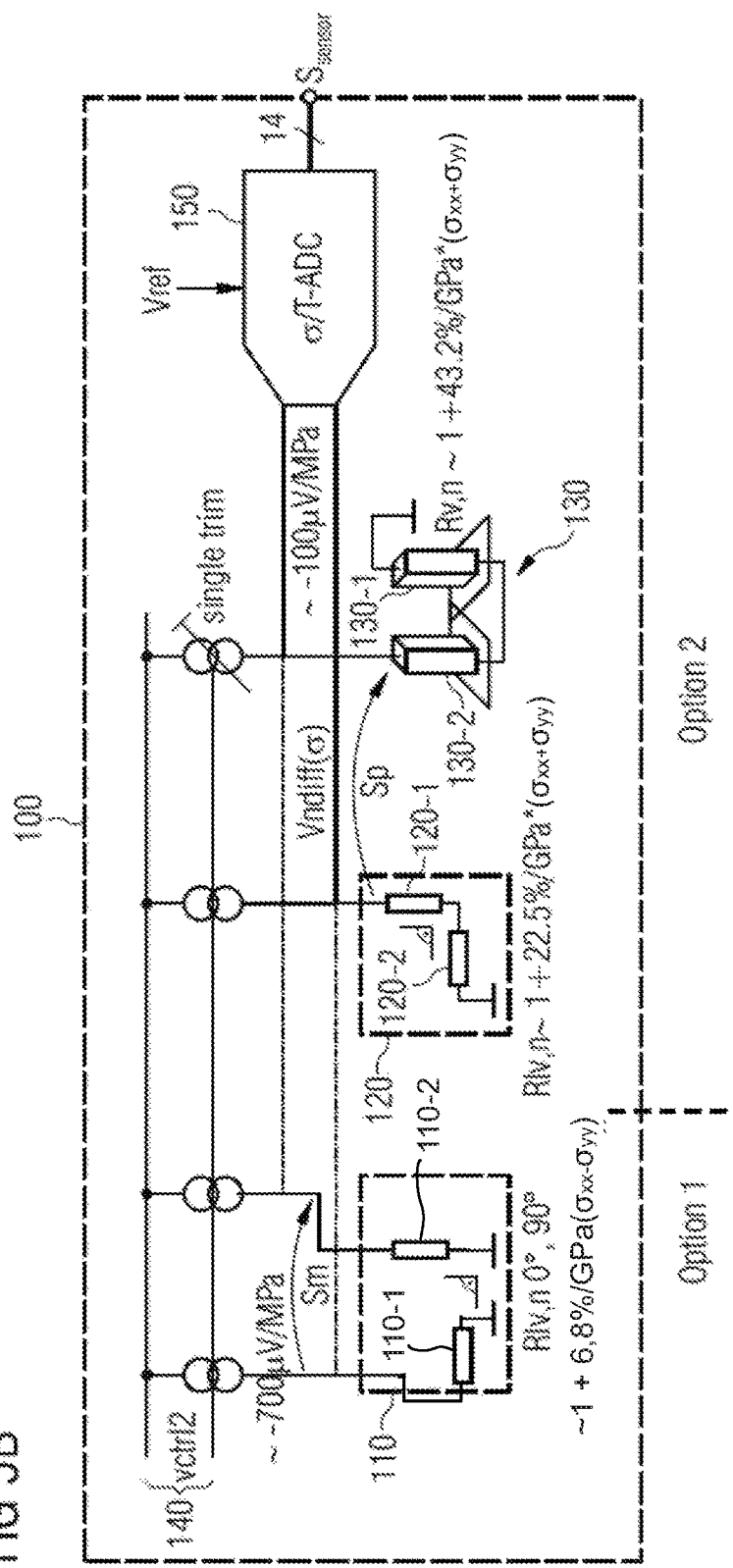

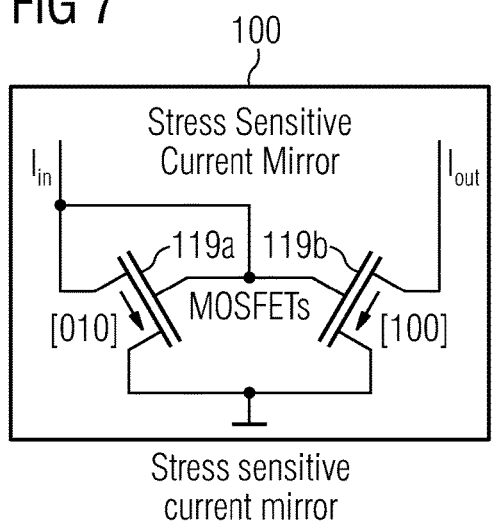
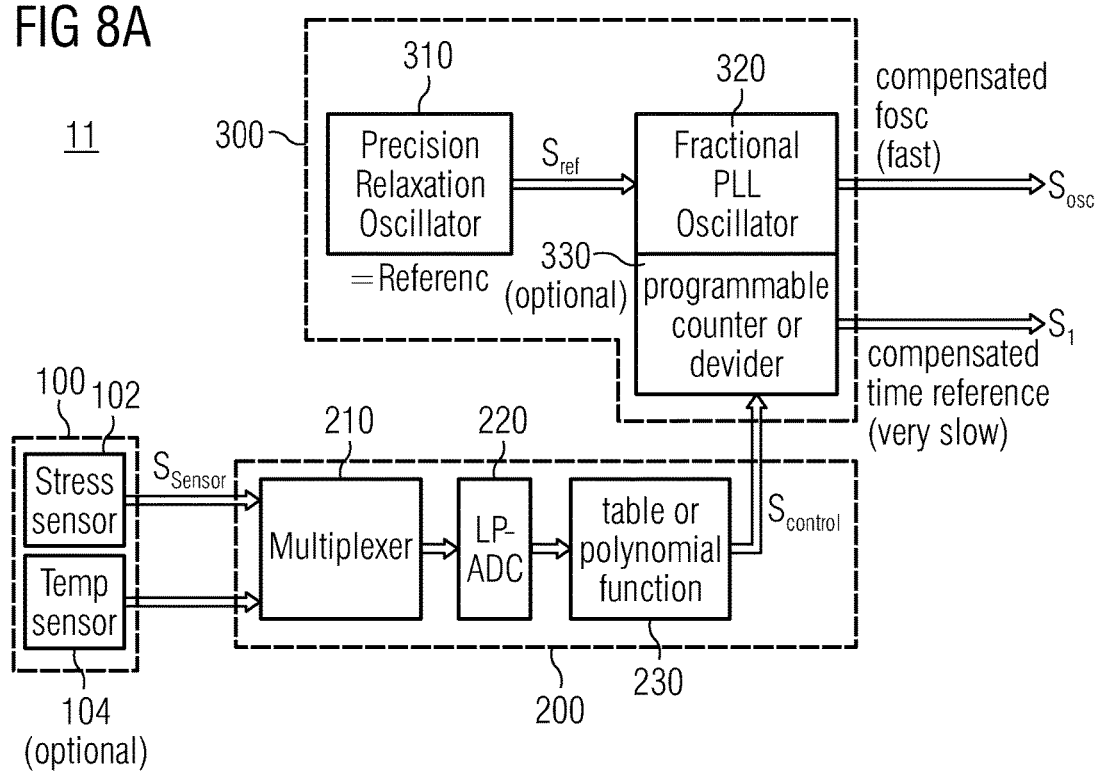

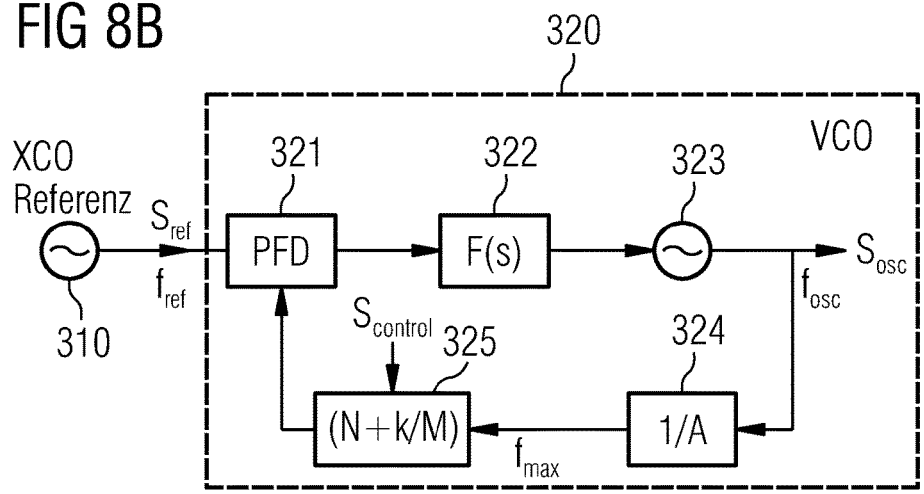
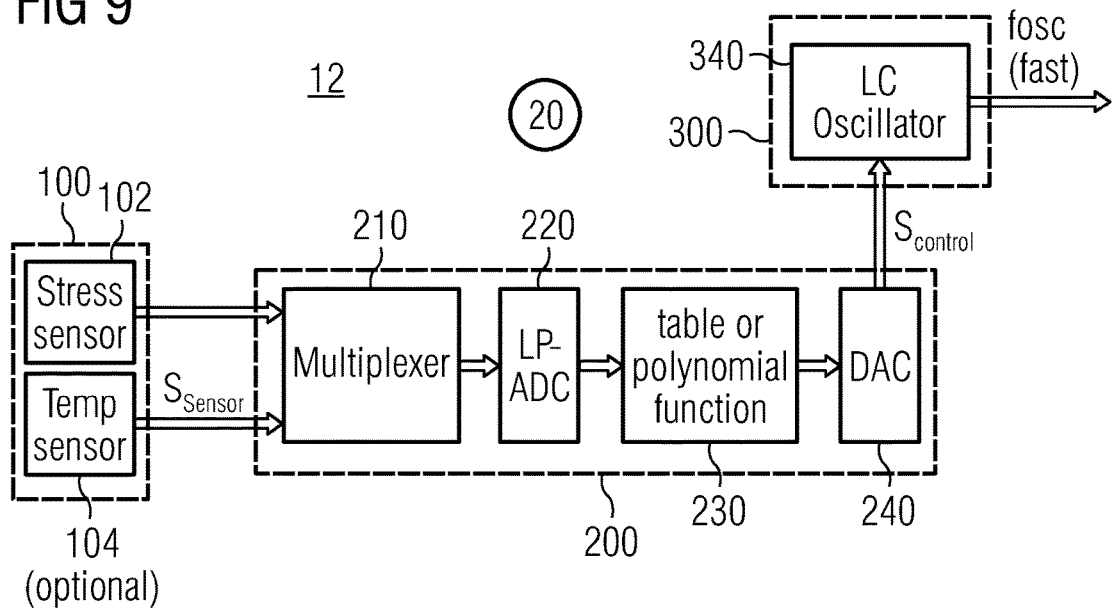

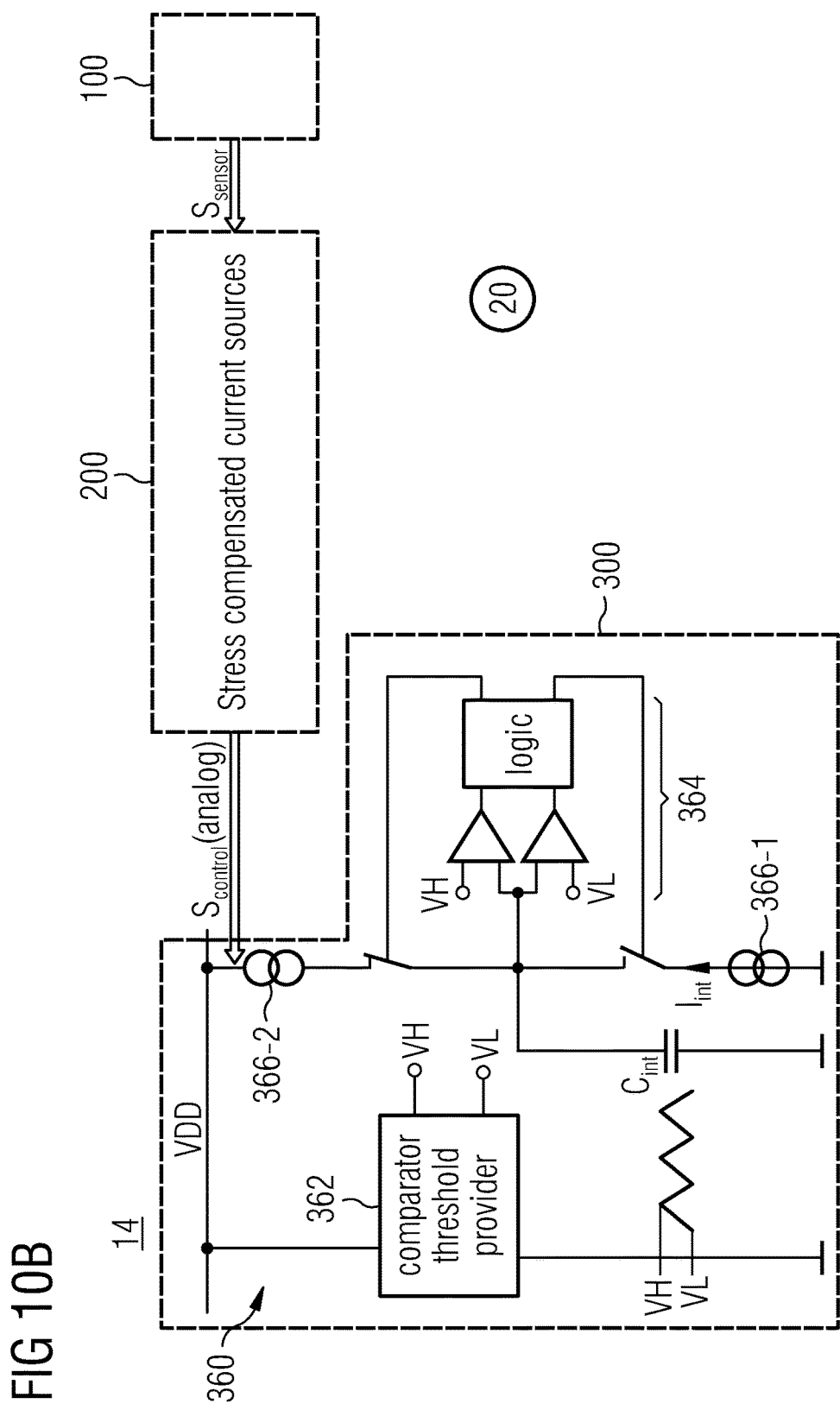

STRESS COMPENSATED OSCILLATOR CIRCUITRY AND INTEGRATED CIRCUIT USING THE SAME

RELATED APPLICATIONS

This application is a continuation-in-part of U.S. patent application Ser. No. 15/042,276, filed Feb. 12, 2016, which claims priority to German Patent Application No. 102015202694.9 filed on Feb. 13, 2015.

TECHNICAL FIELD

Embodiments relate to the field of integrated circuits, and more specifically, to the field of stress compensated oscillator circuitries and integrated circuits using the same. Moreover, embodiments relate to an on-chip oscillator with mechanical stress/strain compensation.

BACKGROUND

Integrated circuitries or integrated circuits (ICs) are typically mounted in plastic packages to protect the sensitive integrated circuitries from environmental influences. However, mounting an integrated circuitry in a plastic package can exert considerable mechanical stress on the semiconductor material and thus on the semiconductor substrate of the integrated circuitry.

The mechanical stress or the mechanical strain present in the semiconductor material of the semiconductor substrate and acting on the integrated circuitry is generally hard to reproduce because the mechanical stress depends on the combination of the materials used for the semiconductor substrate and for the package and, in addition, on the packaging process of the integrated circuitry itself.

Thus, mechanical stress problems are caused by packaging, soldering, humidity changes in plastic packages, bending effects of the die (the semiconductor substrate), trench influences to neighboring devices, etc. The mechanical instabilities lead to current and voltage changes in reference circuits and to changes in passive components like on-chip inductors, capacitors and resistors and active components (e.g. transistors, diodes etc.) in the order of about 3% of the nominal value caused by stress or strain induced piezo-effects in the passive and active components, respectively.

To summarize, mechanical stress seems to be a lifetime effect, but actually 90% of the drift effects of the behavior of integrated circuits is caused by packaging, soldering, humidity, and temperature gradients on the die (i.e. the semiconductor substrate), as an expansion of a plastic package leads to the bending of the chip.

Thus, up to now only 1% to 3% accuracy and stability over lifetime and temperature range of integrated circuitries could be achieved, even with a trimming approach on a wafer.

Therefore, there is a need for improved integrated circuits which work with high precision and high lifetime stability combined with a very low temperature drift and low power or phase noise. Thus, accurate and inexpensive low-power or low-phase noise for on-chip oscillators without external components are required for many integrated circuits (ICs) with digital protocols or RF interfaces.

SUMMARY

Embodiments provide a stress compensated oscillator circuitry, comprising a sensor arrangement for providing a sensor output signal SSensor, wherein the sensor output signal SSensor is based on an instantaneous stress or strain component $\sigma$ in the semiconductor substrate, a processing arrangement for processing the sensor output signal SSensor and providing a control signal SControl depending on the instantaneous stress or strain component $\sigma$ in the semiconductor substrate, and an oscillator arrangement for providing an oscillator output signal Sosc having an oscillator frequency fosc based on the control signal SControl, wherein the control signal SControl controls the oscillator output signal Sosc (e.g. the oscillator frequency Sosc or amplitude Aosc of the oscillator output signal Sosc), and wherein the control signal SControl reduces the influence of the instantaneous stress or strain component $\sigma$ in the semiconductor substrate onto the oscillator output signal Sosc, so that the oscillator circuitry provides a stress compensated oscillator output signal.

The sensor arrangement may comprise a stress-sensitive sensor element and a stress-insensitive resistive element, wherein the stress-sensitive sensor element provides a stress dependent sensor signal having a stress component dependency with respect to at least one of a sum of the normal stress components ($\sigma XX+\sigma YY$), a difference of the normal stress components ($\sigma XX-\sigma YY$) and a shear stress component $\sigma XY$ in the semiconductor substrate, wherein the stress-insensitive resistive element provides a stress-insensitive signal, and wherein the sensor output signal is based on a combination of the stress dependent sensor signal and the stress-insensitive signal.

Embodiments also provide an integrated circuit comprising a stress compensated oscillator circuitry having a sensor arrangement for providing a sensor output signal SSensor, wherein the sensor output signal SSensor is based on an instantaneous stress or strain component $\sigma$ in the semiconductor substrate, a processing arrangement for processing the sensor output signal SSensor and providing a control signal SControl depending on the instantaneous stress or strain component $\sigma$ in the semiconductor substrate, and an oscillator arrangement for providing an oscillator output signal Sosc having an oscillator frequency fosc based on the control signal SControl, wherein the control signal SControl controls the oscillator output signal Sosc (e.g. the oscillator frequency Sosc or amplitude Aosc of the oscillator output signal Sosc), and wherein the control signal SControl reduces the influence of the instantaneous stress or strain component $\sigma$ in the semiconductor substrate onto the oscillator output signal Sosc, so that the oscillator circuitry provides a stress compensated oscillator output signal, and a processing circuitry for performing a processing operation based on the stress compensated oscillator output signal provided by the stress-compensated oscillator circuitry.

The sensor arrangement may comprise a stress-sensitive sensor element and a stress-insensitive resistive element, wherein the stress-sensitive sensor element provides a stress dependent sensor signal having a stress component dependency with respect to at least one of a sum of the normal stress components ($\sigma XX+\sigma YY$), a difference of the normal stress components ($\sigma XX-\sigma YY$) and a shear stress component $\sigma XY$ in the semiconductor substrate, wherein the stress-insensitive resistive element provides a stress-insensitive signal, and wherein the sensor output signal is based on a combination of the stress dependent sensor signal and the stress-insensitive signal.

BRIEF DESCRIPTION OF THE DRAWINGS

For a more complete understanding of the embodiments and the advantages thereof, reference is now made to the following description taken in conjunction with the accompanying drawings, in which:

FIG. 5b shows a schematic block diagram of different implementations of the sensor arrangement with different exemplary sensor elements in accordance with embodiments;

FIG. 7 shows a schematic illustration of an implementation of the sensor arrangement in the form of a stress sensitive current mirror circuit in accordance with embodiments;

FIG. 8a shows a schematic block diagram of a PLL oscillator with stress compensation via digital fractional values in accordance with embodiments;

FIG. 8b shows a schematic block diagram of an exemplary fractional PLL for the PLL oscillator with stress compensation via digital fractional values in accordance with embodiments;

FIG. 9 shows a schematic block diagram of a directly stress compensated LC-oscillator in accordance with embodiments;

FIG. 10b shows a schematic block diagram of a relaxation oscillator with stress compensated integrator current by using a combination of devices with different stress components in accordance with embodiments;

DETAILED DESCRIPTION

Before discussing the embodiments in further detail using the drawings, it is pointed out that in the figures identical elements and elements having the same functionality and/or the same technical or physical effect are provided with the same reference numbers so that the description of these elements and of the functionality thereof illustrated in the different embodiments is mutually exchangeable or may be applied to one another in the different embodiments.

To be more specific, embodiments are discussed in detail below, however, it should be appreciated that the invention provides many applicable inventive concepts that can be embodied in a wide variety of specific contacts. The specific embodiments discussed are merely illustrative of specific ways to make and use the invention, and do not limit the scope of the invention. In the following description of embodiments, the same or similar elements having the same function have associated therewith the same reference signs, and a description of such elements will not be repeated for every embodiment.

In the following, the embodiments will be described in the context of integrated oscillator circuits, for example LC or PLL oscillator circuits. However, the embodiments may also be applied to other integrated circuits, like any integrated circuits, the output signal thereof is not intended to be a signal which is dependent from a physical input signal, e.g. a signal to be measured, such as an external magnetic field or temperature or sensor signal voltage. The concept can also be applied to stabilize voltage or current references or references based on resistor or capacitor values.

Figure 1:
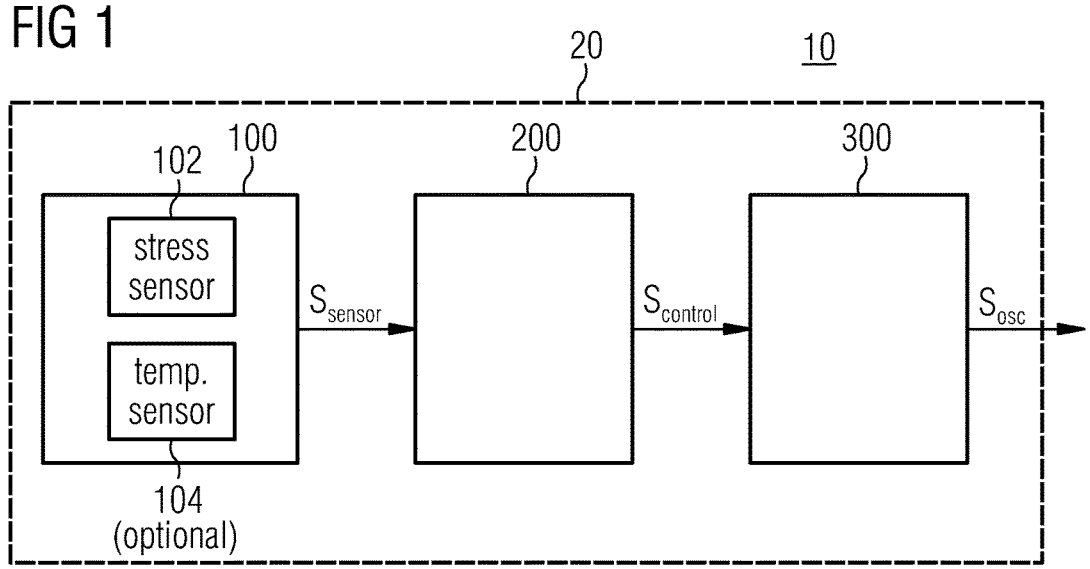
FIG. 1 shows a schematic block diagram of a stress compensated oscillator circuitry in accordance with embodiments.

FIG. 1 is a schematic block diagram of a stress compensated (integrated) oscillator circuitry 10 for providing a stress compensated oscillator output signal sosc. The stress compensated oscillator circuitry 10 comprises a sensor arrangement 100 and is configured to provide a sensor output signal ssensor, wherein the sensor output signal ssensor is based on instantaneous stress or strain component σ in the semiconductor substrate 20.

The stress compensated oscillator circuitry 10 further comprises a processing (rendering) arrangement 200 which is configured to process or render the sensor output signal ssensor and to provide a control signal scontrol depending on the instantaneous stress or strain component in the semiconductor substrate 20 (as measured by the sensor arrangement 100).

The stress compensated oscillator circuitry 10 further comprises an oscillator arrangement 300, which is configured to provide an oscillator output signal sosc having an oscillator frequency fosc, wherein the oscillator output signal is based on the control signal scontrol from the processing arrangement 200.

The control signal scontrol (provided by the processing arrangement 200 to a control input—not shown in FIG. 1—of the oscillator arrangement 300) controls the oscillator output signal sosc (e.g. the oscillator frequency fosc or the oscillator amplitude Aosc of the oscillator output signal sosc), wherein the control signal scontrol reduces the influence of the instantaneous stress or strain component in the semiconductor substrate (as measured by the sensor arrangement 100) onto the oscillator output signal sosc (e.g. onto the oscillator frequency fosc or the oscillator amplitude Aosc of the oscillator output signal sosc), so that the oscillator circuitry 10 provides a stress compensated oscillator output signal sosc.

The sensor arrangement 100, the processing arrangement 200 and the oscillator arrangement 300 may be arranged or integrated on the same semiconductor substrate 20.

As indicated above, the control signal scontrol provided by the processing arrangement is processed or rendered on the basis of the sensor output signal ssensor and controls the oscillator arrangement in order to reduce the influence of the instantaneous stress or strain component in the semiconductor substrate (as measured by the sensor arrangement 100) onto the oscillator output signal sosc. Thus, the oscillator circuitry 10 provides a stress compensated oscillator output signal Sout. Thus, the output signal of the stress compensated oscillator circuitry is within a tolerance range free from the influence of the instantaneous stress or strain component in the semiconductor substrate 20.

Concerning the above indicated "tolerance range", it is to be noted that in the art there are deviations from the theoretical ideal case in all fields of physics, these deviations from the functionality of the compensation concept needing to be sufficiently small only, i.e. the influence of the instantaneous stress or strain component in the semiconductor substrate onto the oscillator frequency fosc or the oscillator amplitude Aosc of the oscillator output signal sosc is reduced by at least 50%, 80%, 90%, 99%, 99.9%, i.e. lie within a tolerance range of 50%, 20%, 10%, 1% or 0.1% form the ideal (stress uninfluenced) oscillator output signal.

Moreover, in order to facilitate the understanding of the following detailed description of the stress compensated oscillator circuitry on a semiconductor substrate for providing a stress compensated oscillator output signal, a brief representation with regard to FIGS. 2a-b of the definitions used below regarding the semiconductor material used and the predefined directions on the same with regard to the crystal alignment of the semiconductor material is provided. The semiconductor surface (die or wafer surface) is associated with a crystallographic plane. To determine the respective plane in a cubic crystal, the so-called Miller indices are used, which are indicated in ground (below). For example, FIG. 2a shows a plan view, for example, of a semiconductor wafer cut in the (100) plane.

Figure 2A:
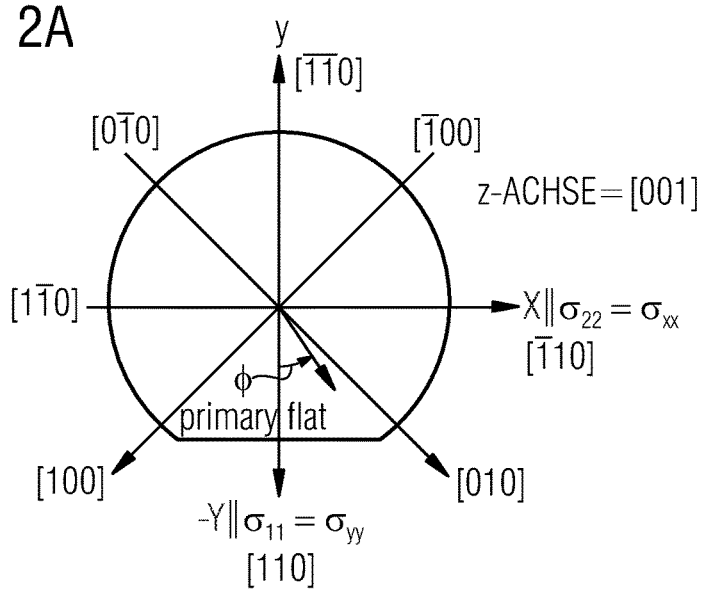
FIGS. 2a-2b show general definitions of the crystallographic directions in the surface plane of the semiconductor substrate.
Figure 2B:
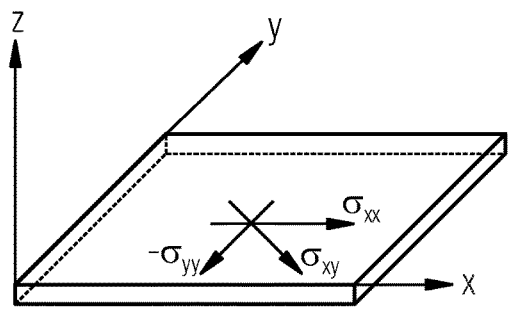

The main crystallographic directions in the wafer plane are marked in FIG. 2a-b with respect to the so-called "primary flat" at the silicon wafer. Usually the edges of the rectangular geometries of the circuit structures on the semiconductor chip extend in parallel with and/or perpendicularly to the primary flats. In FIG. 2a, in particular, the crystallographic directions and/or axes are represented in the plane of the semiconductor wafer, these being represented in square brackets below. The coordinate system is usually employed such that the [110] direction extends perpendicularly to the primary flat, whereas the [110] direction extends in parallel with the primary flat. The directions [010] and [100] here extend at an angle of +/−45° in relation to the [110] direction.

In addition, an angle $\varphi$ is defined in relation to the [110] direction, the angle $\varphi$ being counted in an anti-clockwise manner, starting from the [110] direction, in a plan view of the topside of the wafer. Usually, the individual chips are positioned at the wafer such that the directions $\varphi=0°$ and $\varphi=90°$ correspond to the IC vertical and horizontal directions, respectively.

As a packaged integrated circuit chip is generally structured in a layered manner, a limitation to the planar stress condition is possible, i.e. a limitation to two normal stress components, $\sigma XX$, $\sigma YY$ and one sheer stress component $\sigma XY$, as exemplarily illustrated in FIG. 2b. In accordance with the definition, the x- and y-axes are arranged in parallel with the edges of the semiconductor substrate. The remaining stress components are essentially negligibly small and only have a minor influence on the electronic circuit components. At a sufficiently large distance from the edge of the semiconductor chip and in particular in the center of a semiconductor substrate, the sheer stress component $\sigma XY$ is usually negligibly small. Thus, essentially only the two normal stress components $\sigma XX$ and $\sigma YY$ remain to be considered.

Moreover, a variety of piezo-effects are present in the semiconductor material of a semiconductor material of a semiconductor substrate, such as the piezo-resistive effect, piezo-MOS effect, piezo junction effect, piezo-Hall effect and/or piezo-tunnel effect. Each of these piezo-effects alone or in combination may have an effect on relevant electrical and/or electronic parameters of the integrated circuit due to mechanical stress in the semiconductor substrate of the integrated circuit during operation thereof. In connection with the description below, the general term "instantaneous stress or strain component in the semiconductor substrate" (i.e. piezo-effects and also pure strain effects) is to generally refer to the changes of electrical and/or electronic parameters of the circuitry integrated in the semiconductor substrate under the influence of mechanical stress in the semiconductor material.

Mechanical stress in the semiconductor material results in a change in the properties of the charge carriers with regard to the charge-carrier transport, such as mobility, collision time, scattering factor, etc. In more general words, the piezo-resistive effect determines how the specific ohmic resistance of the respective semiconductor material will behave under the influence of mechanical stress. The piezo junction effect results, for example, in changes in the characteristics of diodes and bipolar transistors. The piezo-tunnel effect occurs at a reversely operated, highly doped, shallow lateral pn-junction. This current is dominated by band-to-band tunnel effects and is also dependent on stresses. Thus, the sensor output signal as sensor of the sensor arrangement 100, e.g. piezo stress sensors, can be used for compensating piezo stress influences.

In accordance with embodiments, the sensor output signal ssensor of the piezo stress sensors of the sensor arrangement 100 can also be used to compensate for strain effects. To be more specific, the expansion of a metal inductance coil of an (LC) oscillator changes, for example, merely by chip (=semiconductor substrate) bending. The piezo-effects in the metal coil, however, can be neglected. Merely due to chip bending, the size of the coil element changes and hence its inductance as well as the width of the conductive trace and accordingly its internal resistance changes. These effects are pure strain effects and describable due to Hooke's law (elastic deformation case).

According to embodiments, the processing arrangement 200 can be configured to consider the plastic deformation case and the viscoelastic deformation case, wherein the history of temperature and stress is detected by the sensor arrangement 100 and is latched in a memory (not shown in FIG. 1) associated to the processing arrangement 200, wherein based on the information stored in the memory and on the instantaneous stress or strain components, measured by the sensor arrangement 100, the processing arrangement

200 can generate and provide the control signal (e.g. correction signals), wherein the control signal, which may comprise a plurality of partial control signals or different correction signals, depends on the direction of the measured stress or strain and on the deviation of the temperature (or temperature gradient) in the semiconductor substrate.

In accordance with embodiments, the sensor arrangement, the processing arrangement and the oscillator arrangement are integrated on the same semiconductor substrate.

In accordance with embodiments, the sensor arrangement for providing a sensor output signal SSENSOR comprises a stress-sensitive sensor element and a stress-insensitive resistive element, wherein the sensor output signal is based on an instantaneous stress or strain component in the semiconductor substrate. The stress-sensitive sensor element provides a stress-dependent sensor signal having a stress component dependency with respect to at least one of a sum of the normal stress components ($\sigma XX+\sigma YY$), a difference of the normal stress components ($\sigma XX-\sigma YY$) and a shear stress component $\sigma XY$ in the semiconductor substrate, wherein the stress-insensitive resistive element provides a stress-insensitive signal, and wherein the sensor output signal is based on a combination of the stress dependent sensor signal and the stress-insensitive signal.

The sensor element may comprise a piezo-sensitive sensor element, wherein the stress-insensitive resistive element may comprise a poly-Si-resistive element (Poly resistor) or a metal resistive element (metal resistor). The stress-sensitive resistive element has a low stress coefficient (low stress dependency) with respect to the strength and direction of the stress in the semiconductor substrate, wherein $\Delta R(\sigma)<5$ or 2%/GPa. The sensor output signal is based on a comparison of the stress dependent sensor signal and the stress-insensitive signal. Thus, The stress-insensitive resistive element is operative as a comparison element with respect to the stress-sensitive sensor element.

In accordance with embodiments, the sensor arrangement may comprise a plurality of sensor elements, each sensor element sensing an instantaneous stress or strain component $\sigma$ in the semiconductor material 20.

In accordance with embodiments, the plurality of sensor elements are configured to sense the instantaneous stress and strain components $\sigma xx$, $\sigma yy$ which are orthogonal to each other and in plane with respect to the surface of the semiconductor substrate.

In accordance with embodiments, the plurality of sensor elements are piezo-sensitive sensor elements.

In accordance with embodiments, the piezo-sensitive sensor elements extend lateral and/or vertical in the semiconductor material with respect to the surface of the semiconductor material and have a high temperature coefficient synchronization, e.g. within a tolerance range of 10%, 5% or less (+/−10%, +/−5% or less).

In accordance with embodiments, a plurality of the sensor elements comprise L-shaped sensor elements and are spatially distributed across the surface of the semiconductor substrate.

In accordance with embodiments, the L-shaped sensor elements are piezo-sensitive diffusion resistors, e.g. having resulting stress coefficients which are independent of the direction of the influencing stress or strain in the semiconductor substrate.

In accordance with embodiments, the plurality of piezo-sensitive sensor elements comprises a first number of piezo-sensitive sensor elements having a first stress coefficient and comprises a second number of piezo-sensitive sensor elements having a second stress coefficient, wherein the first and second stress coefficients are different.

In accordance with embodiments, the first number of piezo-sensitive sensor elements provides a first stress dependent sensor signal having a first stress component dependency and the second number of piezo-sensitive sensor elements providing a second stress dependent sensor output signal having a second stress component dependency, wherein the first stress dependent signal has a stress component dependency with respect to the sum of the normal stress components ($\sigma xx+\sigma yy$) in the semiconductor substrate, and wherein the second number of piezo-sensitive sensor elements provide a second stress dependent signal with a stress component dependency with respect to the difference of the normal stress components ($\sigma xx-\sigma yy$) in the semiconductor substrate.

In accordance with embodiments, the stress compensated oscillator circuitry further comprises a temperature sensor element on or in the semiconductor substrate for providing a temperature sensor signal with respect to the instantaneous temperature of the semiconductor substrate.

In accordance with embodiments, the temperature sensor arrangement comprises a plurality of temperature sensor elements which are spatially distributed over the surface of the semiconductor substrate.

In accordance with embodiments, the plurality of temperature sensor elements form a differential temperature sensor arrangement.

In accordance with embodiments, the processing arrangement is configured to perform a feed-forward sensor output signal processing, i.e. without a feedback loop, for providing the control signal as stress compensation signal to the oscillator arrangement.

In accordance with embodiments, the processing arrangement is configured to retrieve a look-up table or to calculate a polynomial function based on the sensor output signal in order to determine the control signal.

In accordance with embodiments, the processing arrangement is configured to process the sensor output signal in order to provide the control signal which is a combination of a plurality of partial control signals, wherein each partial control signal controls the oscillator frequency of the oscillator output signal and reduces the influence of a different instantaneous component in the semiconductor substrate onto the oscillator frequency of the oscillator output signal.

In accordance with embodiments, the processing arrangement processes the first and second stress dependent sensor signal for providing a first and second (partial) control signal (separating X- and Y-stress dependencies of the oscillator) wherein the first control signal is processed to reduce X-stress dependencies of the oscillator arrangement, wherein the second control signal is processed to reduce Y-stress dependencies of the oscillator arrangement.

In accordance with embodiments, the processing arrangement is configured to process the sensor output signal in order to provide the control signal, wherein the control signal comprises a first (x-control signal) and a second (y-control signal) partial control signal to provide a first and a second (different) partial correction signal for different stress component dependencies of the oscillator arrangement in the semiconductor substrate.

In accordance with embodiments, the processing arrangement is configured to process the sensor output signals from the plurality of temperature sensor elements for determining a temperature dependent stress effect induced to a temperature gradient in the semiconductor substrate, and to provide the control signal which reduces the influence of the instantaneous temperature or temperature gradient in the semiconductor material onto the oscillator frequency of the oscillator output signal so that thermal-gradient-induced stress effects to the oscillator frequency of the oscillator output signal are reduced or compensated.

In accordance with embodiments, the oscillator arrangement comprises an oscillator in a fractional PLL loop, wherein the fractional PLL loop has a (e.g. digital) fractional divider, wherein the processing arrangement is configured to process the sensor output signal and to provide the control signal, wherein the control signal controls the fractional divider of the fractional PLL loop of the oscillator arrangement in order to reduce the influence of the instantaneous stress component in the semiconductor substrate on the oscillator frequency of the oscillator output signal.

In accordance with embodiments, the oscillator arrangement comprises a directly stress compensated LC oscillator or a stress compensated oscillator with a correction DAC for bias current, switchable capacitances and/or voltage-dependent capacitances.

In accordance with embodiments, the oscillator arrangement comprises a relaxation oscillator with a stress-compensated integrator current or stress-compensated reference voltages or stress-compensated integrated capacitances.

In accordance with embodiments, the processing arrangement is configured to provide a plurality of partial control signals to adjust a combination of at least two the following electrical characteristics, the electrical characteristics comprise the integrator current, the reference voltages and/or the integrator capacitances, in order to reduce the influence of the instantaneous stress component in the semiconductor substrate onto the oscillator frequency of the oscillator output signal.

In accordance with embodiments, an integrated circuit comprises the stress compensated oscillator circuitry, and a processing circuitry for performing a processing operation based on or using the stress compensated oscillator output signal provided by the stress-compensated oscillator circuitry.

In accordance with embodiments, the stress compensated oscillator circuitry and the processing circuitry are integrated on the same semiconductor substrate.

In accordance with embodiments, the processing arrangement of the stress compensated oscillator circuitry and the processing circuitry commonly share or double use integrated hardware on the semiconductor substrate.

In accordance with embodiments, the processing arrangement of the stress compensated oscillator circuitry and the processing circuitry commonly use ADCs temperature sensors, voltage references, voltage supplies and bias current supplies with defined temperature coefficients on the same semiconductor substrate.

Embodiments are advantageous as they provide a stress compensated oscillator circuitry for providing a (stress compensated) oscillator output signal fosc with high precision and lifetime stability combined with very low temperature drift and low power or phase noise. Thus, according to embodiments, accurate and inexpensive, low power noise or low phase noise on-chip oscillators without external components are realizable and feasible for a large variety of different integrated circuits with digital protocols or RF interfaces. In accordance with embodiments, a very high accuracy and stability over lifetime and temperature range can be achieved even without trimming on wafer.

Based on the concept, it is now possible to replace crystal oscillators so that additional pins and expensive external components can be avoided.

Moreover, according to the concept, the trimming on wafer with predetermined frequency shift to compensate package effects can be avoided. According to the concept, not only systematic changes can be compensated, but also a not statistical spread of frequency shift can be considered. Moreover, unpredictable lifetime shifts can be pre-compensated.

Further, embodiments are advantageous as they provide a possible synchronization to external clock signals without the requirement of using extra pins or synchronization overhead and without the requirement of an additional PLL circuit.

Further, embodiments are advantageous as they provide an automated stress compensated oscillator circuitry concept when compared to MEMS oscillators, which still require a separated die on top of a microprocessor chip with expensive technology and which are not so accurate as crystal oscillators and are difficult to stabilize.

In accordance with embodiments, the processing arrangement 200 of the stress compensated oscillator circuitry 10 processes the sensor output signal from the sensor arrangement 100 and determines a control signal or a plurality of partial control signals (components) for stress compensation of the oscillator output signal. The control signal (stress dependent influence signal) does not necessarily need a memory for storing comparison values.

In accordance with embodiments, a combination of frequency determining components with different stress components is performed so that the different stress components cancel. For example, a first resistive element (arrangement like L-shape) with positive stress coefficient (i.e. a lateral n diffusion) and a second resistive element (arrangement like L-shape) with negative stress coefficient (e.g. a vertical n diffusion) is used for the sensor elements of the sensor arrangement 100.

According to further embodiments, the sensor arrangement may comprise a stress-sensitive (resistive) sensor element, e.g. with a positive stress coefficient (i.e. a lateral n-diffusion) or with a negative stress coefficient (e.g. a vertical n diffusion) and (as a comparison element) a stress-insensitive resistive element.

In accordance with embodiments, a stress sensor (the stress sensor arrangement 100 with a plurality of sensor elements) is used, wherein the resulting stress signals (sensor output signals as sensor) "correlate" to the undesired influence parameter of the oscillator circuitry and the stress signals are used for stress compensation, i.e. are used by the processing arrangement 200 for determining the control signal scontrol. For example, the stress sensor provides a ($\sigma xx+\sigma yy$) stress dependent signal (dependent on an addition of the normal stress components) and/or a ($\sigma xx-\sigma yy$) stress dependent signal (dependent on a difference of the normal stress components) to determine different correction signals (different control signals scontrol) for the x- and y-direction in the semiconductor substrate (the sensor die). In this connection it is pointed to the fact that, a long resistor parallel to a trench has another stress influence than particular to this trench.

In accordance with embodiments, a stress compensated RC relaxation oscillator is used which controls an LC oscillator in a (fractional) PLL loop.

In accordance with embodiments, a differential temperature sensor is used to determine stress effects especially in LC oscillators (in addition to stress compensation or alone) in order to compensate thermal-gradient-induced stress effects.

Figure 3:
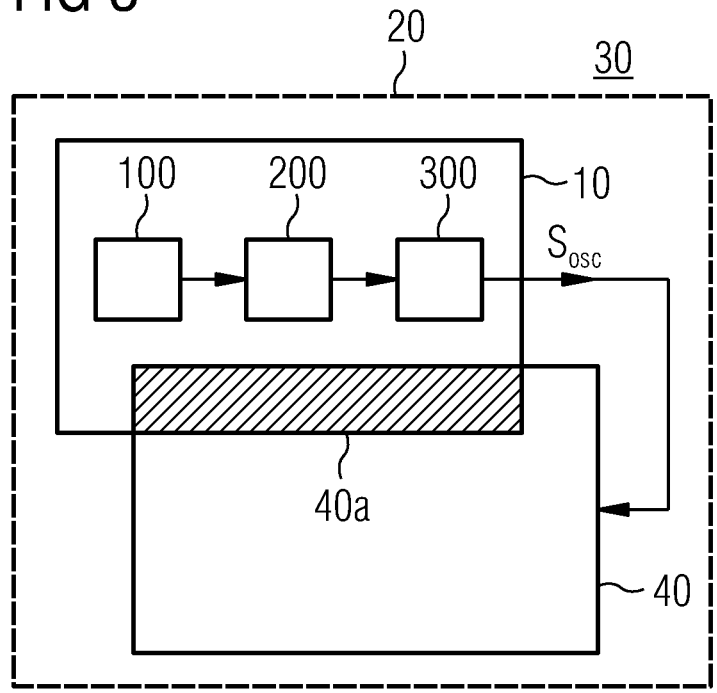
FIG. 3 shows a schematic block diagram of an integrated circuit in accordance with embodiments.

FIG. 3 shows a schematic block diagram of an integrated circuit 30 comprising the stress compensated oscillator circuitry 10 of FIG. 1 and a processing circuitry 40 for performing a processing operation based on or using the stress compensated oscillator signal Sosc provided by the stress compensated oscillator circuitry 10.

In accordance with embodiments, the stress compensated oscillator circuitry 10 and the processing circuitry 40 can be integrated on the same semiconductor substrate 20.

In accordance with embodiments, the processing arrangement 200 of the stress compensated oscillator circuitry 10 and the processing circuitry 40 commonly share or double use integrated hardware elements 40a on the semiconductor structure. The commonly shared integrated hardware is indicated in FIG. 3 by the dashed region 40a, i.e. the overlapping area of the stress compensated oscillator circuitry 10 and the processing circuitry 40 of the integrated circuit 30.

In accordance with embodiments, the processing arrangement 200 of the stress compensated oscillator circuit 310 and the processing circuitry 40 commonly use, for example, ADCs, temperature sensors, voltage references, voltage supplies and/or bias current supplies with defined temperature coefficients on the same semiconductor substrate 20 as the commonly shared integrated hardware 40a.

The processing circuitry 40 may comprise or may be implemented as a microprocessor or a RF chip (i.e. a circuitry for processing or providing an RF signal). Thus, the processing circuitry 40 may be implemented as a dedicated signal processing circuit.

In accordance with embodiments, the integrated circuit 30 comprises the stress compensated oscillator circuitry 10 and a processing circuitry 40 for performing a processing operation based on the stress compensated oscillator output signal provided by the stress compensated oscillator circuitry 10.

Generally, the stress compensated oscillator circuitry can be regarded as a general electronic circuitry for providing a "constant" (e.g. self-generated) output signal, i.e. in contrast to a sensor arrangement for detecting an environmental variable, e.g. an external magnetic field or temperature dependent signal or voltage dependent signal. Thus, the concept can be also applied to any circuitries, such as to voltage, current resistor or capacitor references, which should have no cross sensitivities to other physical or aging effects.

In accordance with embodiments, the integrated circuit 30 can be a monolithically integrated overall system with an on-chip oscillator, e.g. with microprocessor, storage elements, sensor ICs with on-chip signal processor, RF signal processing chip (e.g. WLAN), transceiver chip, etc.

Embodiments are advantageous as they provide substantial additional functions or main functions than compared to a pure oscillator chip. Moreover, the integrated circuit 30 allows a double usage of the further integrated hardware, e.g. ADCs, temperature sensors, voltage references, voltage supplies and/or the provision of bias currents with defined temperature coefficients, etc., on the semiconductor chip by means of the stress compensated oscillator circuitry 10.

Embodiments are advantageous as they provide an integrated circuit 30 which requires less area, less interconnects and less chips in the package than previously known approaches.

The integrated circuit 30 allows a common adjustment during chip production so that associated adjustment efforts are reduced. The integrated circuit 30 has a reduced power consumption by omission of otherwise necessitated interconnect drivers. The integrated circuit 30 allows to control the switching on and off of an oscillator 10 by means of a microprocessor or WLAN chip to save energy in idle breaks and to allow fast wakeup behavior which would otherwise require additional pins (interconnects) and hardware. In accordance with embodiments, the integrated circuit 30 provides an extensive temperature measurement on a microprocessor chip, wherein the extensive Flash or EEPROM storage options and the extensive options of the software or existing hardware allow for the provision of very complex and extensive compensation algorithms.

Figure 4:
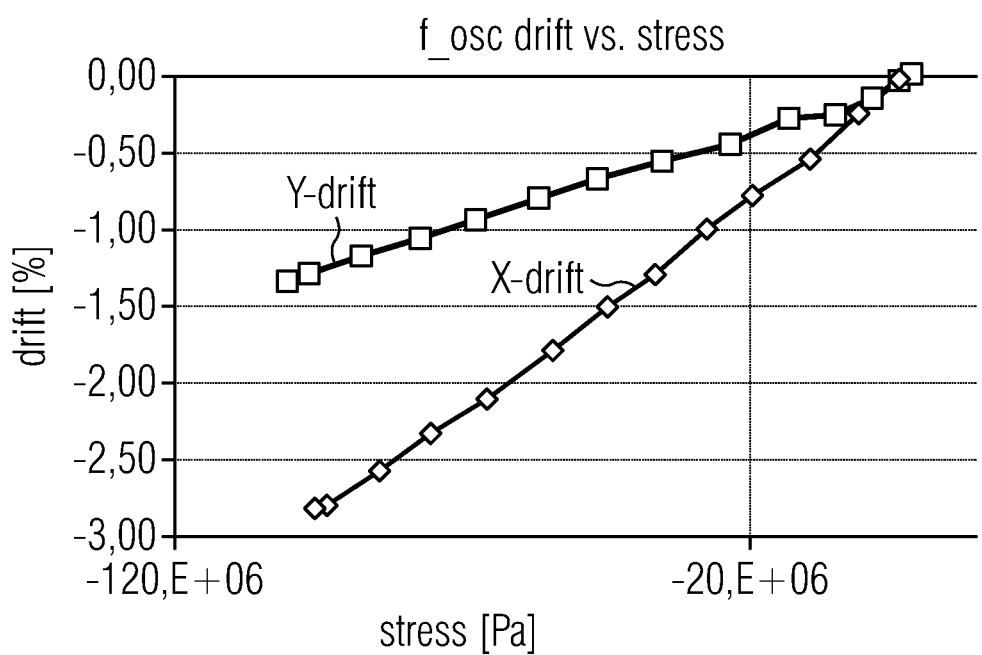
FIG. 4 shows a graphical illustration of the dependency of the oscillator output frequency of an exemplary (relaxation) oscillator from different stress components in the x- and y-direction in the semiconductor substrate.

FIG. 4 shows a schematic diagram of stress measurements (on an exemplary low-power R-C-relaxation oscillator) showing a typical drift behavior of the oscillator frequency of the oscillator output signal versus the instantaneous stress or strain components in the semiconductor substrate. The drift of the oscillator output signal is indicated with different instantaneous in-plane stress of strain components in the x-direction (resulting in the x-drift) and the y-direction (resulting in the y-drift) in the semiconductor substrate.

As shown by the measurement values of FIG. 4, the different dependencies of a (relaxation) oscillator exist with respect to the x- and y-direction of the applied stress (e.g. in a bending experiment). Thus, the diagram of FIG. 4 shows the meaningfulness and relevance of a stress correction or stress compensation which is different in x- and y-directions, for example the relevance of determining different piezo-stress components in the x- and the y-direction in the semiconductor substrate 20.

Such effects as indicated in FIG. 4, i.e. different stress dependencies in the x- and y-direction of the circuitry, occur due to the fact that resistors and/or transistors or other electrical or electronic elements have a different position of respect to the edge of the semiconductor substrate (IC) or have a different position with respect to adjacent insulating trenches. These effects will still be thoroughly described in the following, e.g. with respect to FIGS. 5a-e, 6a-b, 7 and 11a-b.

FIGS. 5a-e show further embodiments of the sensor arrangement 100 of the stress compensated oscillator circuitry 10. To be more specific, FIGS. 5a and 5b each shows a schematic block diagram of different, exemplary sensor elements 110, 120 and 130 for different implementations of the sensor arrangement 100 in accordance with embodiments.

Figure 5A:
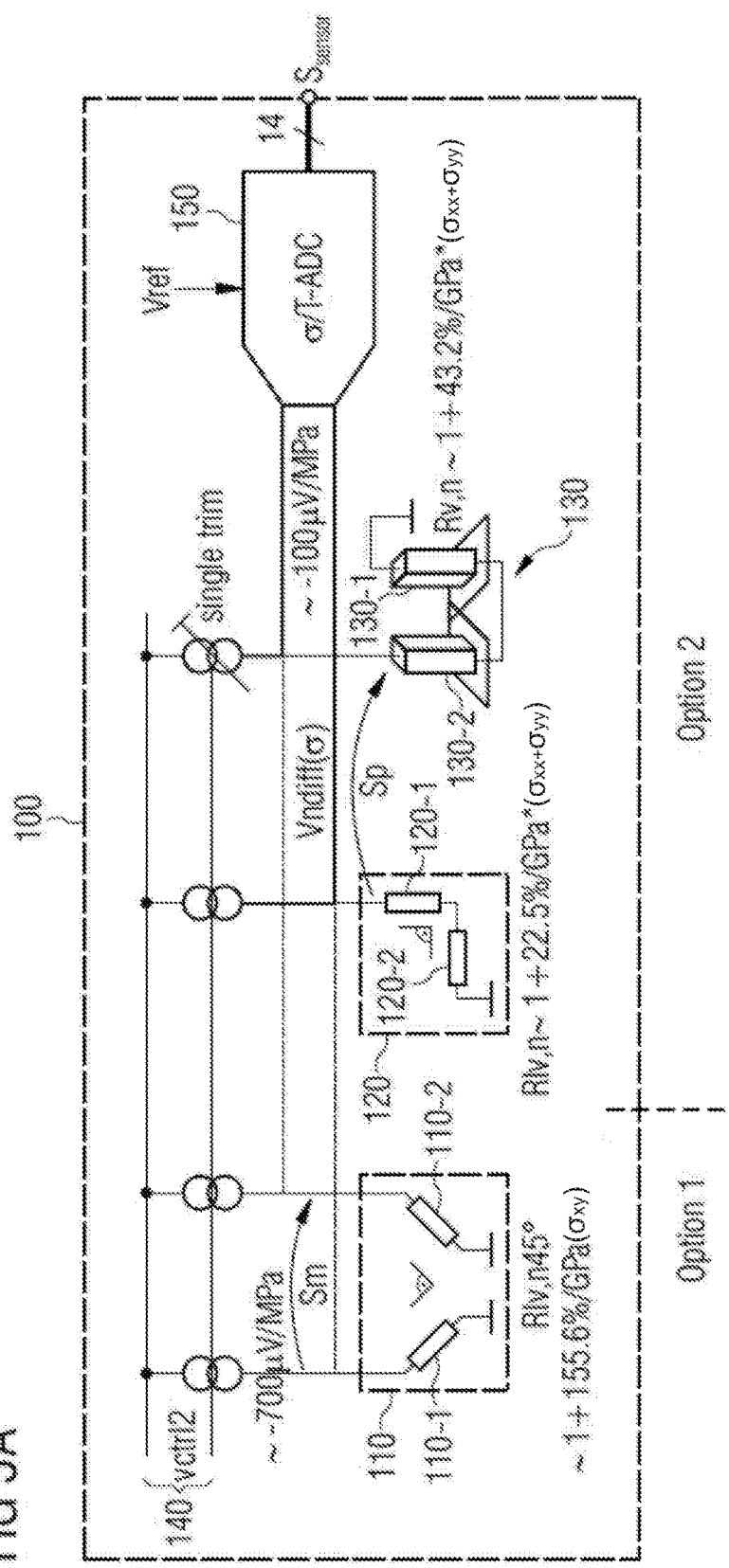
FIG. 5a shows a schematic block diagram of different implementations of the sensor arrangement with different exemplary sensor elements in accordance with embodiments.

As indicated in FIGS. 5a and 5b, the first L-shaped resistor 110 comprises a first and second resistor element 110-1, 110-2 (arranged +/−45° in FIGS. 5a and 0°/90° in FIG. 5b), the second L-shaped resistor 120 comprises a first and a second resistor element 120-1, 120-2, and the third resistor comprises a first and a second resistor element 130-1, 130-2. Each of the resistors are preferably connected between a supply signal source 140 and a ground contact. The sensor output signal Ssensor is provided by a read-out circuit 150 in the form of a σ/T-ADC-circuit which is provided by a reference voltage Vref. A σ/T-ADC-circuit can measure stress components (i.e. σxx+σyy and σxx−σyy and temperature T) in a multiplexed sequence. The adjustment of the oscillator frequency and the stress and temperature sensors can be made preferably at only one temperature measurement (single temperature trim point).

As indicated in FIGS. 5a and 5b, the read-out circuit 150 is, in accordance with different interconnecting options, connectable to the first, second and/or third resistor 110, 120 and 130. The different configurations for reading out the first, second and third L-shaped resistors are indicated in detail below.

The first and second resistor 110 and 120 are so-called L-resistors of two resistor elements of equal size which are arranged such that they are perpendicular to one another and lie "directly" adjacently to one another in/on the semiconductor substrate 20. Moreover, the two orthogonally arranged resistor elements are electrically connected in parallel (elements 110-1 and 110-2) or in series (elements 120-1, 120-2) or the resistor elements are connected to a multiplexer, that allows the measurement of resistor elements in a sequential way.

Figure 5C:
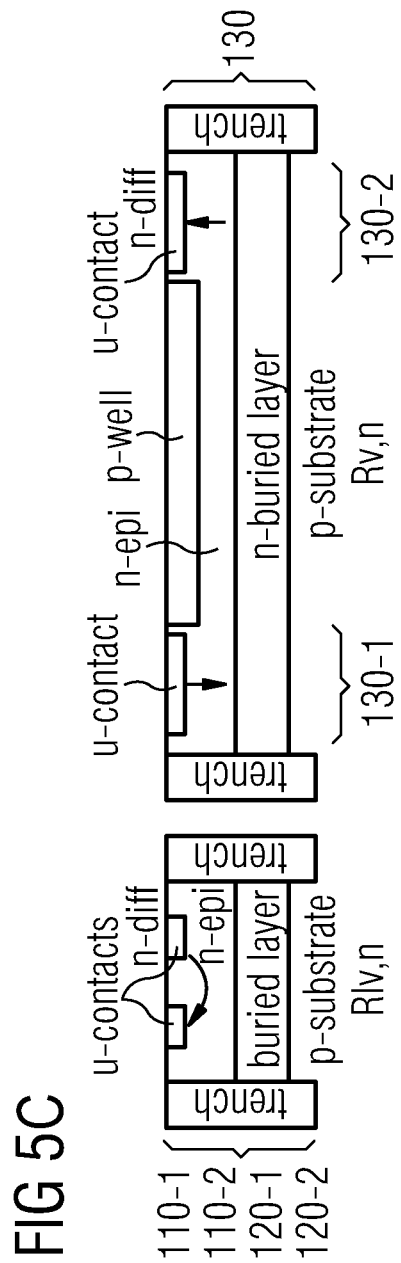
FIG. 5c shows schematic implementations of exemplary sensor elements of the sensor arrangement in accordance with embodiments.

As indicated in FIG. 5c, the left resistor element shows a possible realization of the resistor elements 110-1, 110-2, 120-1, 120-2 of the L-shaped resistors 110 or 120. As shown in the left drawing of FIG. 5c, the resistor element is indicated as resistor element Rlv,n. The index n (=n diffusion) indicates that the resistor element is a resistive element in a n-doped resistive region (n-epi or n-well) in a semiconductor substrate between two contact structures "n-contacts". Moreover, the indices "lv" indicate that the current flow between the two contact regions have a lateral portion and a vertical portion.

As indicated in FIG. 5c, the right resistor element indicates a possible implementation of the resistor elements 130-1, 130-2 of the third resistor 130. As shown with respect to the resistor element Rv,n, this resistor element also is an n-diffusion resistor element, however, only with vertical current directions from the n-contacts through the n-epi-layer or n-well to the n-buried layer with negligible lateral series resistance.

In FIGS. 5a and 5b, the dependencies of the resulting resistance from the stress or strain component in the semiconductor substrate are indicated. As shown in FIG. 5a, it is indicated that the first L-resistor 110 is angularly offset by 45° with respect to the second L-resistor 120. As shown in FIG. 5b, it is indicated that the first L-resistor 110 is angularly offset by 90° with respect to the second L-resistor 120.

As indicated in FIG. 5a, the left 45°-L-resistor 110 (comprising the resistor elements 110-1 and 110-2) provides a stress-dependent output voltage having a ($\sigma XY$) shear stress sensitivity E1 with E1=1+155.6% GPa ($\sigma XY$). As indicated in FIG. 5b, the left 0°/90°-L-resistor 110 (comprising the resistor elements 110-1 and 110-2) provides a stress-dependent output voltage having a ($\sigma XX$ $\sigma YY$) sensitivity E1 with E1=1+6.8% GPa ($\sigma XX-\sigma YY$). Thus, the L-resistor 110 provides a stress dependent output signal which depends on the difference between the normal stress components $\sigma XX$, $\sigma YY$ in the semiconductor substrate and $\sigma=\sigma XX-\sigma YY$.

Moreover, as indicated as a further option in FIGS. 5a and 5b, the signal difference (voltage difference) between the second L-resistor 120 and the vertical resistor 130 provides a stress dependent voltage having a ($\sigma XX+\sigma YY$) sensitivity E2, with E2=1+(43.2-22.5)%/GPa. Thus, the combination of the second and third resistors 120, 130 is sensitive with respect to the sum of the normal stress components and $\sigma XX+\sigma YY$.

Figure 5D:
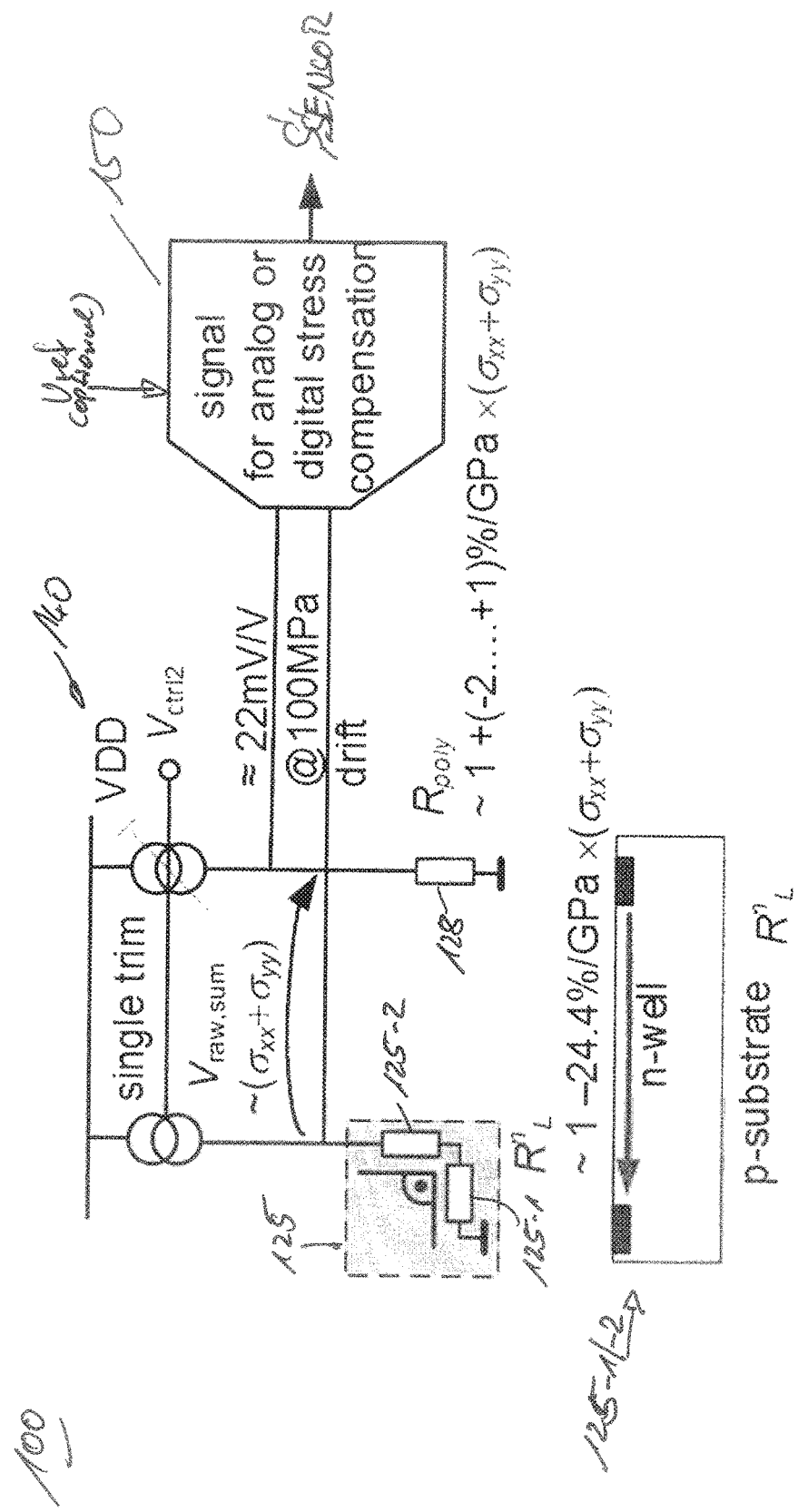
FIG. 5d shows schematic implementations of the sensor arrangement having a stress-sensitive sensor element and a stress-insensitive resistive element in accordance with embodiments.

FIG. 5d shows a schematic block diagram of a further exemplary sensor element 125 for a different implementation of the sensor arrangement 100 in accordance with embodiments.

As indicated in FIG. 5d, the sensor arrangement 100 for providing the sensor output signal SSENSOR comprises a stress-sensitive sensor element 125, e.g. in the form of an L-shaped resistor comprising the resistor elements 125-1 125-2, arranged in a 0°/90° orientation, for example, with respect to the primary flat, and a stress-insensitive resistive element 128 (Rpoly). For example, the stress-sensitive sensor element 125 and the stress-insensitive resistive element 128 are connected between a supply signal source 140 (VDD) and a reference or ground contact. The sensor output signal SSENSOR is provided by a read-output circuit 150, e.g. in the form of a $\sigma/T$-ADC-circuit which may be provided with a reference voltage Vref. The $\sigma/T$-ADC-circuit can measure stress components, i.e. $\sigma XX-\sigma YY$ and $\sigma XX-\sigma YY$ and the temperature T, optionally in a multiplexed sequence. The adjustment of the oscillator frequency and the stress and temperature sensors can be made preferably at only one temperature measurement (single temperature trim point, e.g. VCTRL2).

The stress-sensitive sensor element 125 (stress-sensitive resistor element) is, for example, a so-called L-resistor of two single resistor elements 125-1, 125-2 of equal size which are arranged perpendicular to one another and "directly" adjacently to one another at the surface of the semiconductor substrate 20, i.e. in/on the semiconductor substrate 20. Moreover, the two orthogonally arranged semi-resistor elements 125-1, 125-2 are electrically connected in series.

As further indicated in FIG. 5d, a schematic cross-sectional view through the semiconductor substrate 20 shows a possible realization of the resistor elements 125-1, 125-2 of the L-shaped sensor element 125. As shown in FIG. 5d, the resistor element 125 is indicated as resistor element RnL. The index "n" (=n-diffusion) indicates that the resistor element is a resistive element in an n-doped resistive region (n-epi or n-well) in the semiconductor substrate 20 between two contact structures "n-contacts". Moreover, the index "L" indicates that the current flow between the two contact regions extends essentially in a lateral direction with respect to the surface area of the semiconductor substrate, i.e. has (essentially) only a lateral portion.

In FIG. 5d, the dependency of the resulting resistance of the stress sensitive sensor element 125 (resistor elements 125-1, 125-2) are indicated. As shown in FIG. 5d, it is indicated that the L-resistor 125 has a resulting stress-dependent resistance RnL which is proportional to 1−24.4%/GPa x($\Delta XX+\sigma YY$). Thus, the L-resistor 125 provides a stress-dependent output voltage having a $\sigma XX+\sigma YY$ stress sensitivity E1 with E1~1~24.4%/GPa x($\sigma XX+\sigma YY$).

Furthermore, the resistive element 128, e.g. in the form of a poly-resistor or metal resistor is nearly stress independent, wherein the remaining low stress dependency is independent from the direction of stress in the semiconductor substrate. As shown in FIG. 5d, it is indicated that the poly resistor 128 has a resulting stress-dependent resistance RPOLY which is proportional to 1−(−2 . . . +1) % GPa x($\sigma XX+\sigma YY$).

Thus, the combination Vraw,sum of the resulting signals (output voltages) of the stress-sensitive sensor element 125 and the stress-insensitive resistive element 128 is sensitive with respect to the sum of the normal stress components according to $\sigma XX+\sigma YY$. Thus, the sensor output signal SSensor is based on the sum of the normal stress components $\sigma XX+\sigma YY$.

Figure 5E:
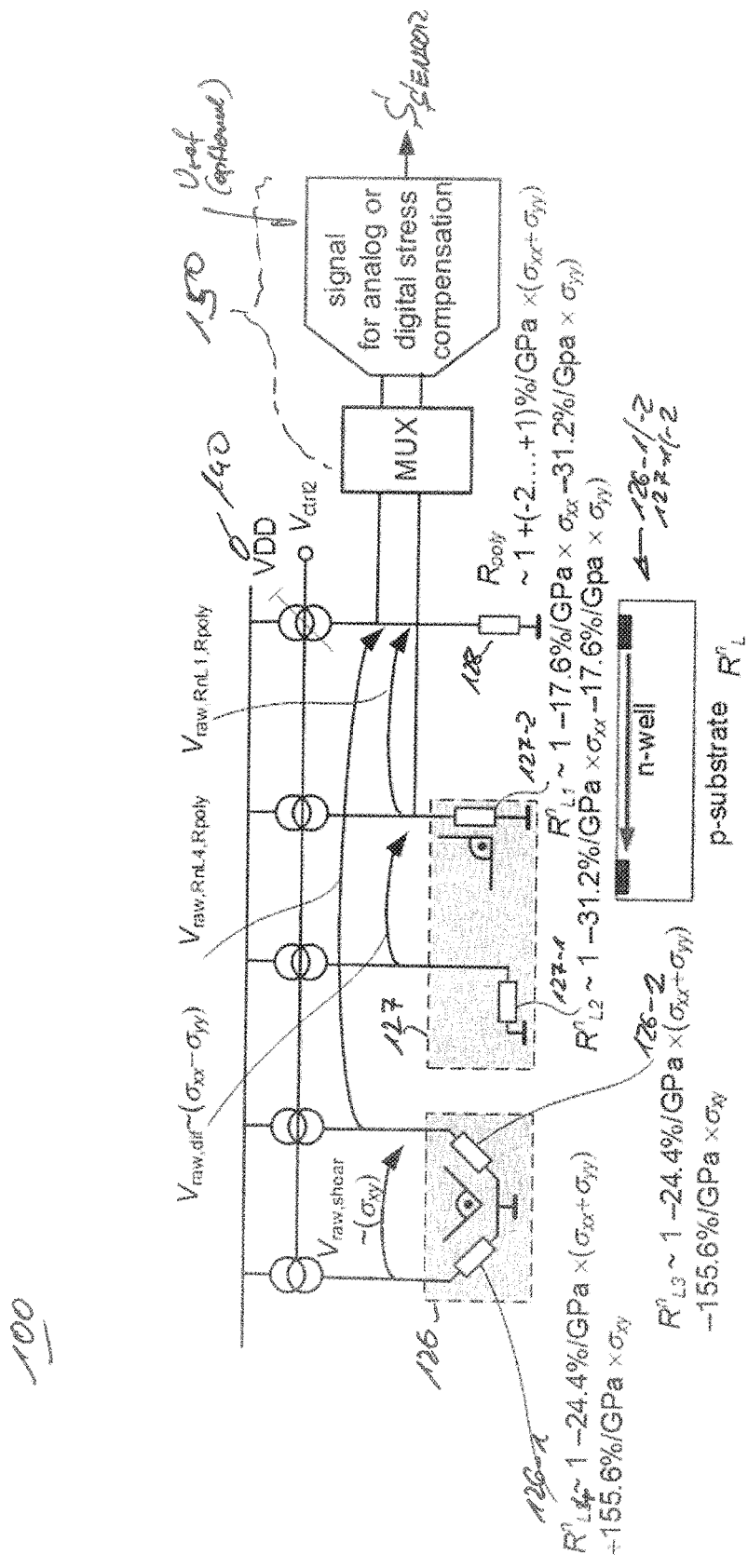
FIG. 5e shows schematic implementations of the sensor arrangement comprising a plurality of sensor-sensitive sensor elements and a stress-insensitive resistive element in accordance with embodiments.

FIG. 5e shows a schematic block diagram of a further exemplary sensor arrangement 100 having exemplary (stress-sensitive) sensor elements 126 and 127 and a stress-insensitive resistive element 128.

As indicated in FIG. 5e, the first stress-sensitive sensor element 126 (first L-shaped resistor 126) comprises a first and second resistor element 126-1, 126-2, which are arranged in a +/−45° orientation with respect to the primary flat, for example, wherein the second stress-sensitive sensor element 127 (the second L-shaped resistor 127) comprises a first and a second resistor element 127-1, 127-2, which are arranged in a 0°/90° configuration with respect to the primary flat, for example, and further a stress-insensitive resistive element 128 (Rpoly). For example, each of the elements 126, 127 and 128 is connected between a supply signal source 140 and a reference or ground contact. The sensor output signal SSENSOR is provided by a read-out circuit 150 in the form of a σ/T-ADC-circuit which is provided by a reference voltage Vref. The σ/T-ADC-circuit can measure stress components (e.g. σXX+σYY and σXX−σYY and σXY and temperature T) in a multiplexed sequence, by means of a multiplexer MUX. The adjustment of the oscillator frequency and the stress and temperature sensors can be made preferably at only one temperature measurement (i.e. at a single temperature trim point, e.g. VCTRL2).

As indicated in FIG. 5e, the read-out circuit 150 is, in accordance with different interconnecting options via the multiplexer MUX, connectable to the first and second stress-sensitive sensor elements 126, 127, to each of the resistor elements 127-1, 127-2, and to the stress-insensitive resistive element 128 (RPOLY). The different configurations for reading out the first and second stress-sensitive sensor elements 126, 127 and the stress-insensitive resistive element 128 are indicated in detail below.

The first and second stress-sensitive sensitive sensor elements (stress sensitive resistors) 126, 127 are so-called L-resistors, the L-resistor 126 having two resistor elements 126-1, 126-2 and the L-resistor 12t having two resistor elements 127-1, 127-2 of the equal size which are arranged perpendicular to one another and "directly" adjacently to one another at the surface of the semiconductor substrate 20 (i.e. in/on the semiconductor substrate 20). Moreover, the two orthogonally arranged resistor elements 126-1, 126-2 of the L-resistor 126 and the two orthogonally resistor elements 127-1, 127-2 of the L-resistor 127 are electrically connected in parallel and are connectible (as parallel circuits) to a multiplexer MUX that allows the measurement of the different resistor elements in a sequential way. Moreover, the two orthogonally resistor elements 126-1, 126-2 of the L-resistor 126, and the two orthogonally resistor elements 127-1, 127-2 of the L-resistor 127 are electrically connected in parallel and are individually connectible to a multiplexer MUX. That allows the measurement of the different resistors 126, 127, 128 and resistor elements 126-1, 126-2, 127-1, 127-2 in a sequential way.

To be more specific, the multiplexer of the read-out circuit 150 allows the measurement of the L-resistors 126, 127 and the stress-insensitive resistive element 128 or (additionally or alternatively) the measurement of the single resistor elements 126-1, 126-2, 127-1, 127-2, alone or in any combination with each other and of the stress-insensitive resistive element 128 (e.g. in a sequential way). Thus, the sensor output signal SSENSOR may have a stress component dependency with respect to at least one of a sum of the normal stress components (σxx+σyy), a difference of the normal stress components (σxx−σyy) and the shear stress component σXY in the semiconductor substrate.

As further indicated in FIG. 5e, the sensor elements 126, 127 (L-resistors) having the resistor elements 126-1, 126-2 and 127-1, 127-2 may be formed in the semiconductor subset 20 as lateral resistor elements RnL1, RnL2, RnL3, RnL4. The index "n" (=n-diffusion) indicates that the respective resistor element is a resistive element in an n-doped resistive region (n-epi or n-well) in a semiconductor substrate between two contact structures "n-contacts". Moreover, the index "L" indicates that the current flow between the two contact regions has essentially only a lateral portion.

FIG. 5e, the dependencies of the resulting resistance RnL from the stress or strain component in the semiconductor substrate are indicated. As shown in FIG. 5e, it is indicated that the L-resistor 126 is angularly offset by the 45° with respect to the second L-resistor 127.

As further indicated in FIG. 5e, the stress-sensitive sensor elements 126-1, 126-2 and 127-1, 127-2 and the stress-insensitive resistive element 128 provide the following resulting stress dependencies, and thus provide the following stress-dependent output voltages having corresponding sensitivities.

As shown in FIG. 5e, it is indicated that the resistor element 126-1 has a resulting stress-dependent resistance:
RnL4~1−24.4%/GPa x(σXX+σYY)+155.6%/GPa x(σXY).

The resistor element 126-2 has a resulting stress-dependent resistance:
RnL3~1−24.4%/GPa x(σXX+σYY)−155.6%/GPa x(σXY).

The resistor element 127-1 has a resulting stress-dependent resistance:
RnL2~1−31.2%/GPa x(σXX)−17.6%/GPa x(σYY).

The resistor element 127-2 has a resulting stress-dependent resistance:
RnL1~1−17.6%/GPa x(σXX)−31.2%/GPa x(σYY).

Furthermore, the resistive element 128, e.g. in the form of a poly-resistor or metal resistor is nearly stress independent, wherein the remaining low stress dependency is (essentially) independent from the direction of stress in the semiconductor substrate.

The poly resistor 128 has a resulting stress-dependent resistance:
RPOLY~1−(−2 . . . +1)%/GPa x(σXX+σYY).

In this connection, the parameter σXY indicates a sheer stress-dependency, wherein the term σsum=σXX+σYY relates to the sum of the normal stress components, wherein the term σdiff=σXX−σYY indicates the difference of the normal stress components.

Thus, the resulting signals (output voltages) of the stress-sensitive sensor element 126, 126-1, 126-2, 127, 127-1, 127-2 and the stress-insensitive resistive element 128 are as follows:

Vraw,shear~(σXY) is based on a combination of the signals of the stress-sensitive sensor elements 126-1 and 126-2.

Vraw,dif~(σXX−σYY) is based on a combination of the signals of the stress-sensitive sensor elements 127-1 and 127-2.

Vraw,RnL4,Rpoly is based on a combination of the signals of the stress-sensitive sensor element 126-2 and the stress-insensitive resistive element 128.

Vraw,RnL1,Rpoly is based on a combination of the signals of the stress-sensitive sensor element 127-2 and the stress-insensitive resistive element 128.

Further combinations of the resulting signals (output voltages) of the stress-sensitive sensor element 126, 126-1, 126-2, 127, 127-1, 127-2 and the stress-insensitive resistive element 128 are derivable. Thus, the sensor output signal SSENSOR may have a stress component dependency with respect to at least one of a sum of the normal stress components (σxx+σyy), a difference of the normal stress components (σxx−σyy) and the shear stress component σXY in the semiconductor substrate.

To summarize, as indicated in FIGS. 5*d* and 5*e* a first (comparison) resistor of a stress sensor is built with a poly-resistor or a metal resistor, which provides a different stress component in comparison to a second L-resistor 125, 126, 127. In practice poly and/or metal resistors have nearly negligible stress dependency.

An arrangement comprising the L-resistor(s) and, as a comparison element, the first resistor may provide an output signal having a stress dependency based on the sum σSUM=σXX+σYY, the difference σDiff=σXX−σYY, the shear stress σXY, and/or further stress components. Thus, stress components can be derived, which depend only on one of L-shape resistor arrangement. Unsilicided poly-silicon resistors consist of crystallites with a small number of orientations, yet there is no preference for x- and y-directions. Therefore, a single poly-silicon resistor has the same isotropic stress-dependence law as single crystal resistors in L-layout. Thus the poly resistor does not need an L-shape arrangement, because of its small remaining stress dependency and it's independency from the direction of stress. Its small remaining stress dependency is only dependent from (σXX+σYY). Alternatively a metal resistor can be used instead of a poly resistor, which has no piezo stress components and only some small strain dependency, which influence is one to more orders lower.

According to FIG. 5*d*, an n-doped resistor with L-shaped layout together with a poly- or metal-resistor (which does not need L-shaped layout) may be used for a stress sensor or a stress-compensated oscillator. The resulting sensor arrangement provides a sensor signal having a stress dependency according to the sum of normal stress components (σXX+σYY).

According to FIG. 5*e*, "usage of additional node voltages inherent this stress sensor to use other stress components for stress compensation (i.e. the difference of normal stress components σXX−σYY).

The embodiments as described with respect to FIGS. 5*d* and 5*e* show a sensor arrangement 100 which comprises at least one (or a plurality of) stress-sensitive sensor element(s) and at least one (or a plurality of) stress-insensitive resistive element(s) 128 as comparison element(s). The stress-insensitive resistive elements 128, e.g. in the form of a poly-resistor or metal-resistor, may form a nearly stress-independent stress sensor or stress reference device. The remaining stress dependency of the resistive element 128 is (essentially) independent from the direction of stress and thus the resistive element 128 does not require an L-shaped layout. Moreover, the stress-sensitive sensor elements 126, 127 may be implemented as lateral n-diffusion (n-well; n-epi) resistors. With respect to the above description in connection with FIGS. 5*a-e*, it should become clear that also the complementary (p) doping type may be used for the stress-sensitive sensor elements.

With respect to the above description of the different stress-sensitive sensor elements 110, 120, 125, 126, 127 and 130 with respect to FIGS. 5*a-e* it is indicated that the different stress-sensitive sensor elements can be arbitrarily chosen alone or in any combination with each other for the sensor arrangement 100. Thus, the sensor arrangement 100 for providing a sensor output signal SSENSOR comprises at least one stress-sensitive sensor element or a plurality of stress-sensitive sensor elements chosen of the sensor elements 110, 120, 130, 125, 126, 127 as described in FIGS. 5*a-e*, as well as the stress-insensitive resistive element 128.

To summarize, the stress compensated oscillator circuitry may comprise a sensor arrangement 100 for providing a sensor output signal SSensor, the sensor, wherein the arrangement 100 comprises a (i.e. at least one) stress-sensitive sensor element 110, 120, 125, 126, 127, 130 and a stress-insensitive resistive element 128, and wherein the sensor output signal SSensor is based on an instantaneous stress or strain component σ in the semiconductor substrate 20. The arrangement 100 further comprises a processing arrangement 200 for processing the sensor output signal SSensor and providing a control signal SControl depending on the instantaneous stress or strain component σ in the semiconductor substrate 20, an oscillator arrangement 300 for providing an oscillator output signal Sosc having an oscillator frequency fosc based on the control signal SControl. The stress-sensitive sensor element provides a stress dependent sensor signal having a stress component dependency with respect to at least one of a sum of the normal stress components (σxx+σyy), a difference of the normal stress components (σxx−σyy) and the shear stress component σXY in the semiconductor substrate, wherein the stress-insensitive resistive element provides a stress-insensitive signal, and wherein the sensor output signal SSensor is based on a combination of the stress dependent sensor signal and the stress-insensitive signal. The control signal SControl controls the oscillator output signal Sosc, wherein the control signal SControl reduces the influence of the instantaneous stress or strain component σ in the semiconductor substrate 20 onto the oscillator output signal Sosc, so that the oscillator circuitry 10 provides a stress compensated oscillator output signal Sosc.

The sensor element may comprise a piezo-sensitive sensor element, wherein the stress-insensitive resistive element may comprise a Poly-Si resistive element or a metal resistive element. The stress-insensitive resistive element has a low stress coefficient, with ΔR(σ)<5 or 2%/GPa. The sensor output signal SSensor may be based on a comparison of the stress dependent sensor signal and the stress-insensitive signal.

The sensor arrangement 100 may comprise a plurality of stress-sensitive sensor elements, each sensor element sensing an instantaneous stress or strain component σ in the semiconductor material 20. The plurality of stress-sensitive sensor elements may be configured to sense the instantaneous stress and strain components σxx, σyy which are orthogonal to each other and in plane with respect to the surface of the semiconductor substrate 20. The plurality of stress-sensitive sensor elements may be piezo-sensitive sensor elements.

The plurality of stress-sensitive sensor elements may comprise lateral piezo-sensitive sensor elements which extend lateral in the semiconductor material with respect to the surface of the semiconductor material and further comprises vertical piezo-sensitive sensor elements, which extend vertical in the semiconductor material with respect to the surface of the semiconductor material. The lateral piezo-sensitive sensor elements are L-shaped and are spatially distributed across the surface of the semiconductor substrate. The L-shaped sensor elements may be piezo-sensitive diffusion resistors.

The plurality of piezo-sensitive sensor elements may comprise a first number of piezo-sensitive sensor elements having a first stress coefficient and may comprise a second number of piezo-sensitive sensor elements having a second stress coefficient, wherein the first and second stress coefficients are different. Thus, the first number of piezo-sensitive sensor elements provides a first stress dependent sensor signal having a first stress component dependency and the second number of piezo-sensitive sensor elements providing a second stress dependent sensor output signal having a second stress component dependency, wherein the first stress dependent signal has a stress component dependency with respect to the sum of the normal stress components (σxx+σyy) in the semiconductor substrate, and wherein the second number of piezo-sensitive sensor elements provide a second stress dependent signal with a stress component dependency with respect to the difference of the normal stress components (σxx−σyy) in the semiconductor substrate.

According to further embodiments (not shown in FIG. 5e), the multiplexer of the read-out circuit 150 may be replaced by a wired or hardwired implementation (e.g. bridge circuit) of the sensor arrangement 100 for providing the sensor output signal SSENSOR having a stress component dependency with respect to a sum of the normal stress components (σxx+σyy), a difference of the normal stress components (σxx−σyy) and/or the shear stress component σXY in the semiconductor substrate. The resulting sensor arrangement 100 may comprise one of the L-resistors 126 and 127 and the stress-insensitive resistive element 128. Also, the resulting sensor arrangement 100 may comprise at least one of the single resistor elements 126-1 and 126-2 and the stress-insensitive resistive element 128. Also, the resulting sensor arrangement 100 may comprise at least one of the single resistor elements 127-1 and 127-2 and the stress-insensitive resistive element 128.

Figure 6A:
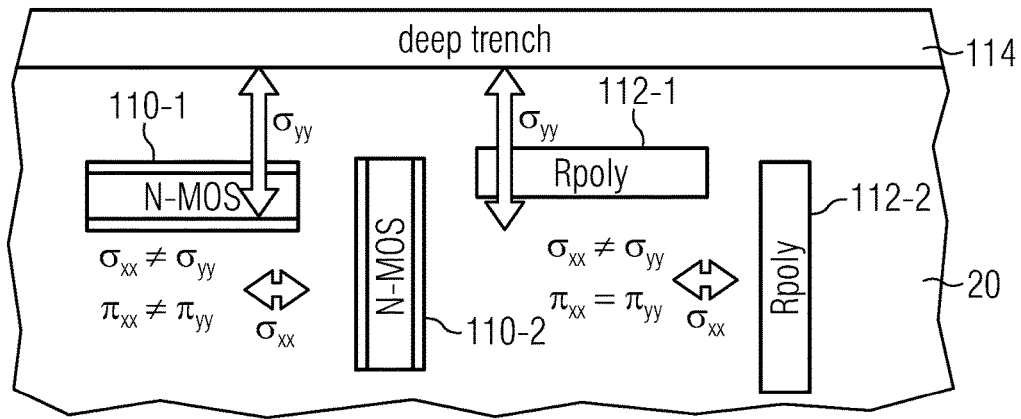
FIG. 6a shows a schematic top view illustration of exemplary sensor elements of the sensor arrangement and of the influence of a deep trench arranged nearby to the sensor elements onto the different stress components acting on the sensor elements and onto the different piezo coefficients of the sensor elements in accordance with embodiments.
Figure 6B:
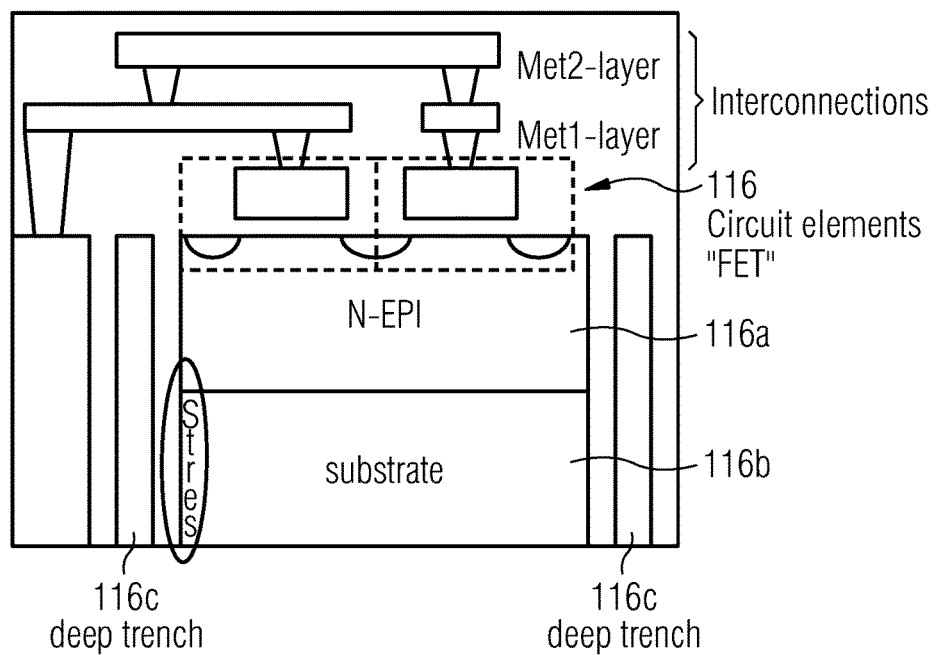
FIG. 6b a schematic cross-sectional illustration of exemplary sensor elements of the sensor arrangement and of the influence of a deep trench arranged near the exemplary sensor elements onto the different stress components acting on the sensor elements and onto the different piezo coefficients of the sensor elements in accordance with embodiments.

FIGS. 6a-b show a schematic illustration (as top view and as a cross-sectional view) of the influence of a deep trench arranged near to exemplary circuit elements (which determine the oscillator frequency) onto the different stress components acting to the circuit elements and onto the different piezo coefficients of the circuits elements in accordance with embodiments. Exemplary circuit elements are, for example, stress sensor elements, resistive elements of a RC-relaxation oscillator and/or transistor elements for a current mirror circuit (which provide the bias current for the LC oscillators) etc.

FIG. 6a provides an exemplary layout arrangement (top view) of resistors (n-MOS or poly), transistors (not shown) and insulating trenches 114. The insulating trenches (deep or shallow trench) 114 have a very different elastic modulus with respect to the silicon material of the substrate 20. Thus, the isolating trench 114 generates different stress variations, even with homogenous y-in plane-stress. This is indicated by the different stress components σYY and σXX. As indicated, the locally generated stress σXX, σYY can be different with regards to size and direction.

Additionally, there are further circuit elements (resistors, transistors (not shown in FIG. 6a), etc.), which are laid out in a specific direction and hence also show different reactions to x- and y-stress or strain. Thus, the position of these circuit elements (not shown in FIG. 6a) with respect to the trenches or to the chip edges is relevant and should be considered when processing and determining the control signal by means of the processing arrangement 200. In this connection, it is further pointed to out to the explanations with respect to FIG. 4.

FIG. 6b shows a schematic illustration (as a cross-sectional view) of the influence of a deep trench arranged near exemplary circuit elements or sensor elements to the different stress components acting to the circuit elements or sensor elements, and onto the different piezo coefficients of the circuit elements or sensor elements in accordance with the embodiments.

FIG. 6b shows exemplary circuit elements in form of n-channel transistors 116 within a n-epi-region 116a of semiconductor substrate 116b. The FETs 116 are separated from neighboring circuit elements (not shown in FIG. 6b) by means of deep trenches 116c. The metallization layers 118 (Met1, Met2) provide the electrical interconnection to further circuit elements (not shown in FIG. 6b).

As indicated in FIG. 6b, in deep regions of the semiconductor substrate, stress components (deep stress) can occur in the circuit element. The transistors or resistors on the surface are influenced by this local stress effects. I.e. the mobility of a n-channel transistor between the n-diffusion source and drain contacts is influenced by stress.

In accordance with embodiments, the following considerations are based on the explanations with respect to FIGS. 5a-e and 6a-b and provide further information for providing an improved stress sensor arrangement 100 for the stress compensated oscillator circuitry 10.

In the following, two considerations can be combined in accordance with embodiments.

Any combinations of the stress components σXX and σYY can be obtained based on two signals, namely the signal Sp~σXX+σYY and the signal Sm~σXY (e.g. FIG. 5a, 5e) or SmσXX−σYY (e.g. FIG. 5b, 5e).

Stress sensors for Sp and Sm can measure the two combinations of stress sensor components Sp~σXX+σYY and Sm~σXX−σYY with high sensitivity as well as minor errors due to temperature variations and manufacturing tolerances.

Stress sensors for Sp can be taken from examples e.g. described above. For this, either two differently doped resistive elements can be compared (e.g. an n-doped to a p-doped resistor or an NMOS to a PMOS or a low-doped n-resistor to a high-doped n-resistor). Alternatively, lateral and vertical resistive elements with different piezo stress dependencies can be compared to one another, wherein the first have current flow mainly in lateral direction (parallel to the chip surface) and the latter have current flow mainly in the direction vertical to the chip surface). The advantage of the last solution is better temperature difference and lower technology spread.

When then the mechanical tension or stress changes, the ratio between the resistors changes, or for example, the conductivity of MOS transistors or the VBE or beta of bipolar transistors (all piezo-effects).

By rotating the rectangular arrangement of resistors or MOS transistors by 45° in the layout, σXY can be measured instead of σXX−σYY, wherein, with p-doped elements, a higher sensitivity results for σXY and with n-doped elements a higher sensitivity for σXX−σYY.

The combination means for Sp and Sm can be a linear combination, e.g. k1*Sp+k2Sm with any coefficients k1, k2, in particular, k1=1 and k2=1 or k2=−1. Nonlinear combinations are also possible, such as k1*Sp^e1+k2*Sp^e2 or (k1*Sp+k2*Sm)^e1 with the real valued exponents e1 and e2.

Thereby, stress sensitivities can be corrected differently in X-direction than in Y-direction. This is, for example, necessitated for different adjacent layouts, e.g. trenches or different distances to the chip edges.

FIG. 7 shows a schematic illustration of a sensor arrangement 100 in the form of stress sensitive current mirror circuit in accordance with embodiments. The stress sensitive current mirror circuit comprises the MOSFETs 119a, 119b which are arranged in the semiconductor substrate in a +/−45° L-shaped layout so that the resulting current through the first FET 119a flows along the [010] direction (see FIG. 2a) and the resulting current through the second FET 119b flows along the [100] direction (see FIG. 2a).

Based on this circuit configuration of the FETs 119a, 119b, the resulting stress components σXY can be measured via the ratio of the currents Tout to Tin for n-Mos transistors in FIG. 7.

If, alternatively, a 0°/90° L-shaped layout of the n-MOS transistors (not shown in FIG. 7) would be used instead of the +/−45° layout (as shown in FIG. 7) the resulting stress component σxx−σyy can be measured via the ratio of the currents Iout to Iin.

FIG. 8a shows a schematic block diagram of a stress compensated oscillator circuitry 11 according to embodiments, wherein the oscillator arrangement 300 comprises a PLL oscillator 320 with stress compensation via digital fractional values. FIG. 8b shows a schematic block diagram of an exemplary fractional PLL 320 (PLL=Phase Locked Loop) in accordance with embodiments.

As shown in FIG. 8a, the sensor arrangement 100 comprises a stress sensor 102 and optionally a temperature sensor 104. The sensor output signal as sensor is provided to the processing arrangement 200, wherein the processing arrangement 200 comprises a multiplexer 210, an LP-ADC 220 (Low Power-Analog/Digital-Converter), and a circuit 230 for querying a table, e.g. a look-up table, or for calculating a polynomial function (i.e. the terms of a polynomial function or a piecewise linear function or any other mathematical function). These function can include temperature dependent coefficients.

The processing circuit 200 provides as output signal the control signal scontrol to the oscillator arrangement 300. The oscillator arrangement 300 comprises a precision relaxation oscillator 310, a fractional PLL oscillator 320 for providing the compensated oscillator output signal sosc and, optionally, a programmable counter or divider circuit 330.

FIG. 8b shows an example for a fractional PLL circuit. As shown in FIG. 8b, the fractional PLL oscillator 320 comprises as reference source Sref, e.g. in form of a precision relaxation oscillator 310. The fractional PLL oscillator 320 comprises a phase detector PFD 321, a filter circuit 322, and voltage control oscillator 323, and in a feedback loop a fixed 1/A divider circuit 324 and a fractional 1/N divider circuit 325.

The phase detector 321 compares its two input signals and produces an error signal which is proportional to their phase difference. The error signal is then low pass filtered in the circuit 322 and is used to drive the voltage controlled oscillator VCO 323, which creates an output phase. The output signal is fed through a divider (fixed divider circuit 324 and fractional divider circuit 325) back to the input of the system, producing a negative feedback loop. The fractional divider circuit 325 is configured to provide a non-integer multiple of the reference frequency in accordance with the following relation of the digital fractional divider:

$$f_{osc}=A*(N+k/M)*f_{ref}.$$

wherein the term k/M depends on the control signal $s_{control}$.

The fractional divider circuit can also be combined with a pseudo-random or sigma delta modulation in order to lower noise at the oscillator output signal sosc. The oscillator output signal has low phase noise and is temperature and stress compensated at the same time.

In the following, the functionality of the stress compensated oscillator circuitry 111 as illustrated in FIGS. 8a-b is explained in detail in accordance with embodiments.

The stress sensors 102 and (optionally) temperature sensors 104 are queried from time to time via the multiplexer 210 with low-power ADC 220, e.g. every 0.5 . . . 2 ms for being able to follow thermal transient times, or even several seconds when the IC has been in a sleep mode. The digital result influences the digital divider 325 of the fractional PLL 320 via a lookup table or a calculating unit 23 which calculates a digital dividing ratio (N+k/M), with the help of polynomial calculations (e.g. 1st and 2nd order).

The stress-dependent dividing ratio can be superposed to a different dividing ratio for fine tuning the output frequency (not shown in the figure).

The high (but fine-tuned and stress-compensated) output frequency fosc in the fractional PLL 320 can, for example, be generated by an LC oscillator (e.g. 2.4 GHz), which is initially not very exact. The exact (but still to be stress-compensated) precision relaxation oscillator 310 provides a reference signal Sref with fief (for example 100 kHz), by which the fractionally divided oscillator frequency fosc of the output is divided down.

By fractional division (e.g. dividing ratio varies intermittently from 1/N to 1/(N+k/M), e.g. 1/4 to 1/5) very fine-tuned output frequencies can be set and hence very fine-tuned temperature and stress compensations and fine-tuned oscillator frequency can be performed.

The advantage is that the precision relaxation oscillator shows very good basic accuracy, but provides only a fixed frequency, while the output signal can be very fine-tuned and shows low phase noise.

Additionally, the fractional dividing ratio can be distributed in time by sigma-delta methods, such that the same can be easily filtered to provide low-noise output frequency.

By dividing down this output frequency, very exact time bases can also be provided for other applications (shown in dashed lines). For example, for specific protocol requirements or for sensors having a time base as a reference.

Polynomials can be formed, for example, with:

Dout1=Dout1ref+($\alpha_1\Delta T+\beta_1\Delta T$) with $\Delta T=T-Tref$

T measured temperature

Tref reference or adjustment temperature

Dout1 digital polynomial partial result

Dout1ref digital reference value

Dout2=Dout2ref+($\alpha_2 \Delta\sigma_{xx}+\beta_2 \Delta\sigma_{xx}$) with $\Delta\sigma=\sigma_{xx}-\sigma_{xxref}$ $\sigma_{xx}$ measured piezo effect in X-direction to the crystal direction of the wafer die $\sigma_{xxref}$ stress measurement at the reference time Dout2 digital polynomial partial result Dout2ref digital reference value Dout3=Dout3 ref+($\alpha_3 \Delta\sigma_{yy}+\beta_3 \Delta\sigma_{yy}$ with $\Delta\sigma=\sigma_{yy}-\sigma_{yyref}$ $\sigma_{yy}$ measured piezo effect in X-direction to the crystal direction of the wafer die $\sigma_{yyref}$ stress measurement at the reference time Dout2 digital polynomial partial result Dout2ref digital reference value $\sigma_{xx}$ and $\sigma_{yy}$ can be calculated from the favored piezo component sensors providing, for example, $\sigma_{xx}+\sigma_{yy}$ or $\sigma_{xx}-\sigma_{yy}$ As shown in FIG. 8b, the control signal provided by the processing arrangement 200 controls the fractional divider circuit 325 of the fractional PLL oscillator 320.

FIG. 9 shows a schematic block diagram of a stress compensated oscillator circuitry 12 according to another embodiment, wherein the stress compensated oscillator circuitry 12 comprises a directly stress compensated LC oscillator 340, e.g. a direct compensated LC oscillator with stress dependent fractional PLL input.

As shown in FIG. 9, the stress compensated oscillator circuitry 10 comprises a sensor arrangement 100 with a stress sensor circuit 102 and an optional temperature sensor circuit 104. The processing arrangement 200 comprises a multiplexer circuit 210, an LP-ADC-circuit 220 and a circuit 230 for querying a LUT (look-up table) or for calculating a polynomial function (i.e. the terms of the polynomial function) and a DAC-circuit 240 (DAC=Digital/Analog Converter) 240.

The oscillator arrangement 300 comprises an LC-oscillator 340 for providing the oscillator output signal sosc having the oscillator output frequency fosc.

The oscillator 340 may be an LC oscillator, but the use of a relaxation oscillator or a ring oscillator is also possible, which is provided on the chip 20 and is corrected directly via DAC 240 from the AD-converted stress and/or temperature signal ssensor. For this, the digital stress and temperature signals are read out again via a lookup table or subject to polynomial calculation by means of the circuit 230. Usually a polynomial calculation requires much less EEPROM memory bits and less reference points.

In this connection, it pointed out that an analog compensation of temperature sensors directly on the oscillator would also be possible, but more complex compensations and higher order compensations and cross couplings between the sensors and to the oscillator may impede the adjustment. The piezo stress components themselves, for example, are temperature-dependent. Analog replica circuits translating a stress voltage to an oscillator frequency may have themselves inaccuracies which can also be temperature and stress-dependent (e.g. the offset of an OPV (op-amp) in an analog replica circuit). Above that, fine-tuning of analog elements may be difficult to perform.

Thus, the sensor output signal SSENSOR of the sensor arrangement 100 may have a stress component dependency with respect to at least one of a sum of the normal stress components ($\sigma xx+\sigma yy$), a difference of the normal stress components ($\sigma xx-\sigma yy$) and the shear stress component $\sigma XY$ in the semiconductor substrate, as exemplary described with respect to FIGS. 5a-e, 6a-b, 7 and 11a-b, for example. An n-doped resistor with L-shaped layout together with a poly- or metal-resistor (which does not need L-shaped layout) may be used for a stress sensor or a stress-compensated oscillator. The resulting sensor arrangement provides a sensor signal having a stress dependency according to the sum of normal stress components ($\sigma XX+\sigma YY$), see for example FIGS. 5d-e. Moreover, "usage of additional node voltages inherent this stress sensor to use other stress components for stress compensation (i.e. the difference of normal stress components $\sigma XX-\sigma YY$), see for example FIGS. 5d-e.

The stress compensated oscillator circuitry 12 of FIG. 9 allows for a replacement of crystal and MEMs oscillators, for an indirectly improved system (with the oscillator frequency), and for double used information from stress and temperature. The double used information may provide additional system parameters for improvement or error detection or functional safety.

Figure 10A:
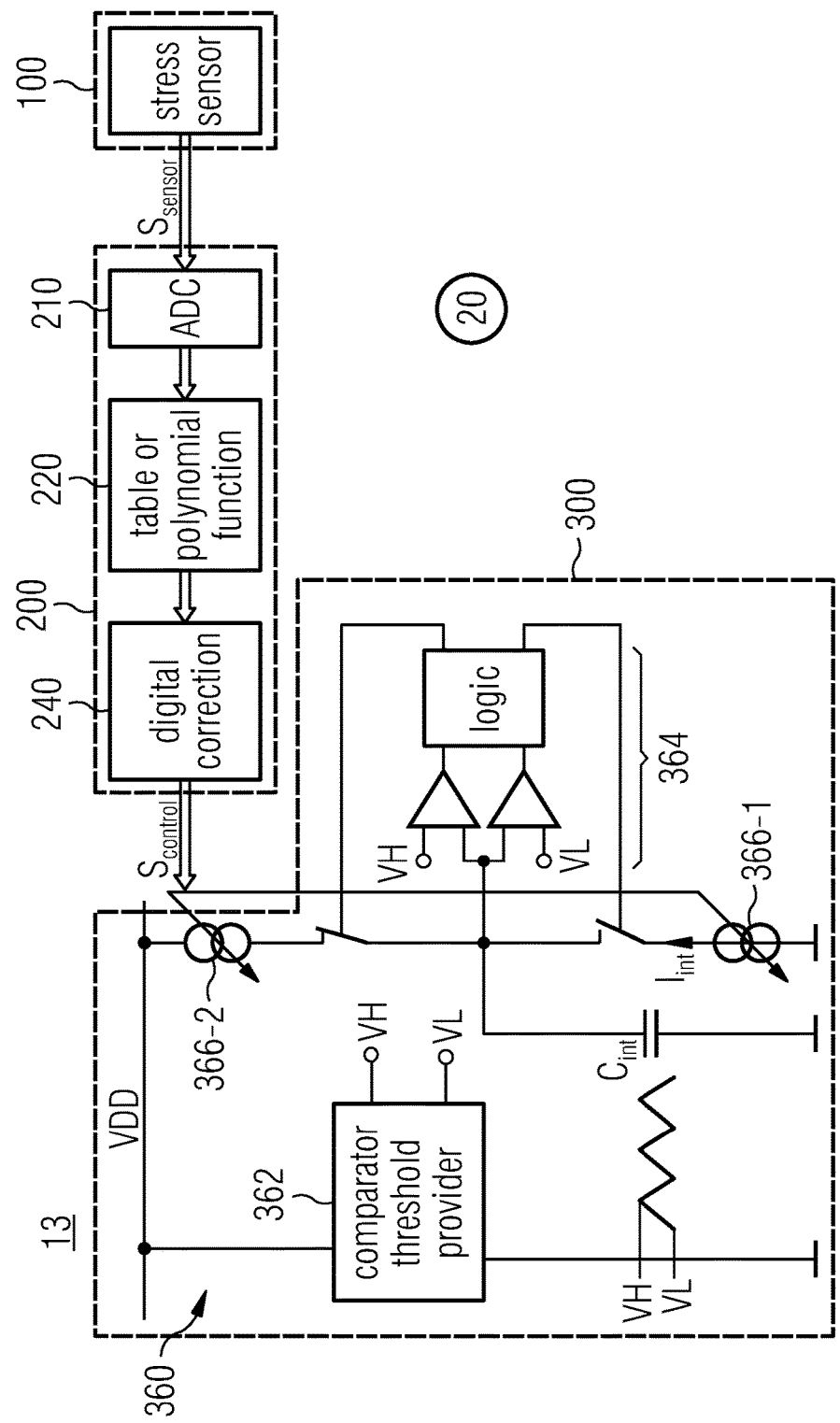
FIG. 10a shows a schematic block diagram of a stress compensated oscillator with correction DAC for the integrator current in accordance with embodiments.

FIG. 10a shows a stress compensated oscillator circuitry 13, wherein the sensor arrangement 100 comprises a stress sensor for providing the sensor output signal ssensor to the processing arrangement 200. The processing arrangement 200 comprises an ADC-circuit 210, a circuit for querying a look-up table or for calculating a polynomial function (i.e. the terms of the polynomial function) 230 and a digital correction DAC-circuit 250 for providing the control signal scontrol.

The oscillator arrangement 300 may comprise a relaxation oscillator 360 with voltage references VH, VL provided by voltage reference provider 362 for the comparator 364. Switchable up and down integrator currents 366-1, 366-2, the two-threshold comparator 364 and the control signal scontrol, e.g. a stress and optionally temperature-dependent DAC compensation signal. As shown in FIG. 10a, the integrated current 366-1, 366-2 is tuned.

As shown in FIG. 10a, the control signal scontrol output by the DAC 240 can switch the integrator currents 366-1, 366-2. Alternatively or additionally the DAC 240 can also change voltage references (e.g. DAC with voltage output) or switch capacitance fields (C-array, C-DAC). Thus, FIG. 10a shows a stress compensated oscillator with correction DAC for the integrator current.

FIG. 10b shows a further embodiment of the stress compensated oscillator circuitry, similar to the one of FIG. 10a. FIG. 10b shows a stress compensated oscillator circuitry 14, wherein the sensor arrangement 100 comprises a stress sensor for providing the sensor output signal ssensor to the processing arrangement 200. The processing arrangement 200 processes the sensor output signal ssensor and provides an "analog" control signal scontrol. The oscillator arrangement 300 may comprise a relaxation oscillator 360 with voltage references VH, VL provided by voltage reference provider 362 for the comparator 364, and the integrator currents 366-1, 366-2.

As shown in FIG. 10b, the it is indicated in a relaxation oscillator 360 that the integration currents can also be stress-compensated in an analog manner. As mentioned: the actual implementation may be more difficult and less exact, but more area-efficient. The sub-currents can be generated by mixing currents having different stress dependencies. This is indicated in the formulas below. Thus, FIG. 10b shows a relaxation oscillator with stress compensated integrator current by using combination of devices with different stress components.

Example for weighted bias current generation to compensate stress effects in circuits (for +/−45° resistor elements, such as shown in FIG. 5a):

$$I_{bias\_stresscomp(x+y)} = \frac{V_{replica1\_bandgap}}{(R_{lv,n}(\sigma, T) + k_1 \cdot R_{v,n}(\sigma, T))} \sim \frac{1}{1 + (22.5\%/GPa) + k_1 \cdot (43.2\%/GPa)}$$

$$I_{bias\_stresscomp(xy)} = \frac{k_2 \cdot V_{replica2\_bandgap}}{(R_{lv,n+45°}(\sigma, T) - R_{vl,n-45°}(\sigma, T))} \sim \frac{k_2}{1 + (155, 6\%/GPa)}$$

Example for weighted bias current generation to compensate stress effects in circuits (for 0°/90° resistor elements, such as shown in FIG. 5b):

$$I_{bias\_stresscomp(x+y)} = \frac{V_{replica1\_bandgap}}{(R_{lv,n}(\sigma, T) + k_1 \cdot R_{v,n}(\sigma, T))} \sim \frac{1}{1 + (22.5\%/GPa) + k_1 \cdot (43.2\%/GPa)}$$

$$I_{bias\_stresscomp(x-y)} = \frac{k_2 \cdot V_{replica2\_bandgap}}{(R_{lv,n0°}(\sigma, T) - R_{vl,n90°}(\sigma, T))} \sim \frac{k_2}{1 + (6, 8\%/GPa)}$$

Example:

A relaxation-type oscillator 360 uses an integrating current $I_{int}$, two reference voltages VH=Vref+ and VL=Vref− and an integration capacitor $C_{int}$. By up- and down-integrating the current $I_{int}$ on capacitor $C_{int}$ until the reference voltages Vref+ or Vref− are reached, an output frequency $f_{osc}$ is build.

$$f_{osc} = \frac{I_{int}}{2 \cdot (v_{ref+} - V_{ref-}) \cdot C_{int}}$$

$$I_{int} = I_{intpstress} \pm I_{intnstress}$$

$$I_{intpstress} = f_p(\sigma)$$

$$I_{intnstress} = f_n(\sigma)$$

The bandgap-based reference voltages Vref+ or Vref− are temperature-compensated and only a little bit stress-dependent (by small piezo-junction effects and small influence of piezo-resistance effect of used resistors, which changes the bias current and thus the Vbe=Vntat only by a logarithmic function from collector current to Vbe). The capacitor Cint is also nearly stress independent. The delay in the comparator 364 decreases a little bit to oscillator frequency fosc and is a bit stress dependent, because the mobility in the differential input pair is a bit stress dependent by piezo-MOS effect=piezo-resistive effect in transistor channel. The main stress influence comes from the used bias resistors in the bandgap, which have a big piezo-resistive effect, and which are mirrored to the integration current Iint.

A temperature compensation of integrating current Iint with low technology spread can be done by adding or subtracting currents coming from voltages used in a bandgap circuit with different temperature gradients (Vptat and Vntat). In both voltage branches resistors of the same resistor type are usually used to reject technology influencers to the TC (temperature coefficient) of Iint. Finally Iint or Cint is trimmed to a desired fosc, but that can usually be done at only one temperature.

The resulting $f_{osc}$ is mainly stress-dependent to 1/R with R=f(σ). Often used n-doped poly-resistors has a stress coefficient of −11%/GPa, which lead to about 3% frequency shift at 200 MPa in-plane stress in and around the middle of the chip by a normal packaging process and to about +/−0.7% instability by humidity changes and lifetime effects and soldering.

But in the near of trenches the stress can change in a different manner (values an X or X dependency), but still correlates with global stress. This can be compensated with a second constant current, which uses also bandgap-inherent voltages Vptat and Vntat to realize temperature compensation. For instance an L-shape p-doped resistor with +4.4%/GPa can be added in the same or a different bandgap circuit with a current ratio of about 4.4/11 compared to the n-poly-based current. The L-shape of diffused resistors is important to make the stress coefficient independent to the direction of stress.

The difference of the L-shaped arms can be used to separate X- and Y-stress dependencies of the oscillator. The resulting Iint can now designed to be nearly stress-compensated or the ratio between both resistor types can be now adjusted to compensate remaining stress effects in comparator delay or reference voltages or capacitor. For a first order compensation of stress and temperature it is enough to adjust it with a fixed ratio.

Figure 11A:
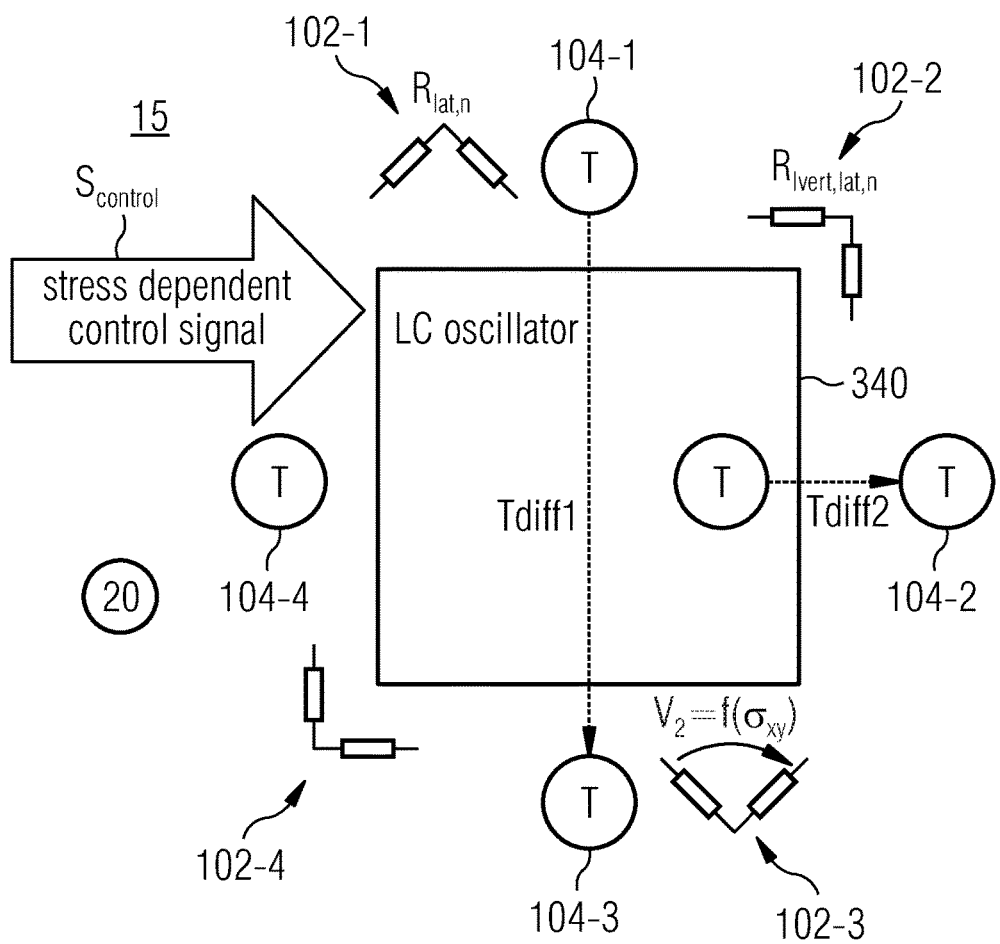
FIG. 11a shows a schematic illustration of an LC oscillator with stress sensors and differential temperature sensors in accordance with embodiments.
Figure 11B:
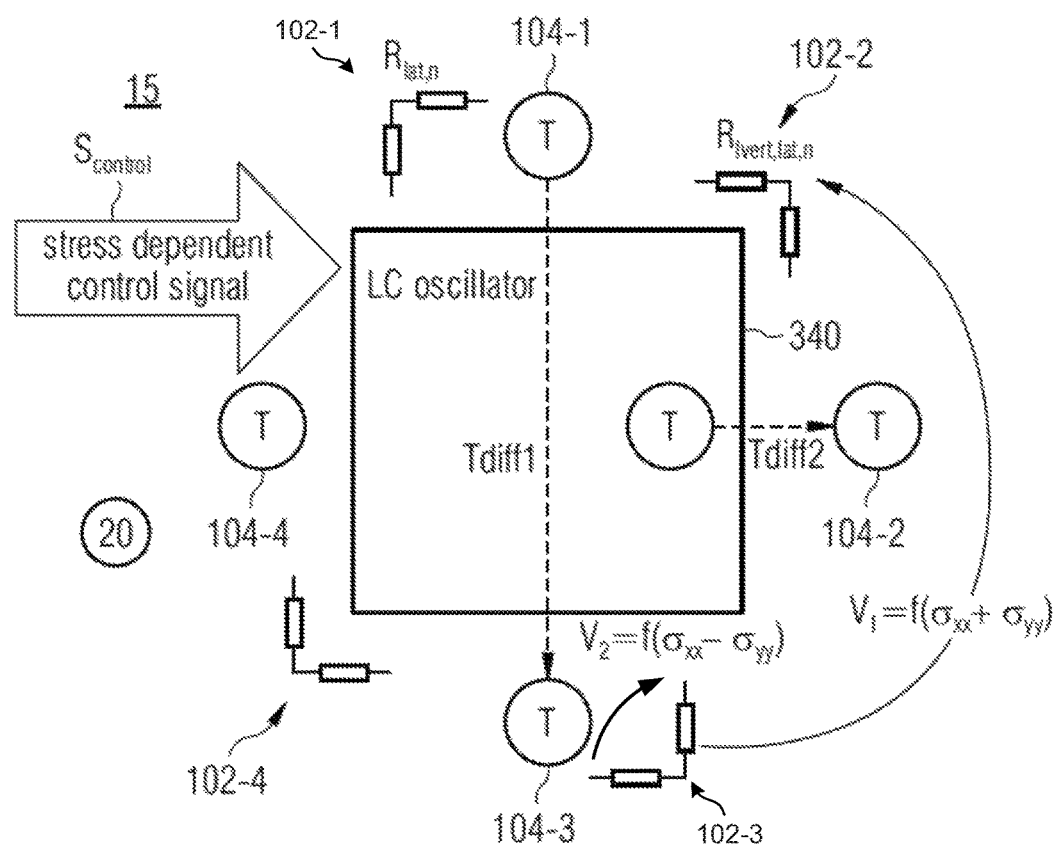
FIG. 11b shows a schematic illustration of an LC oscillator with stress sensors and differential temperature sensors in accordance with embodiments.

FIGS. 11a and 11b show a stress compensated oscillator circuitry 15 according to a further embodiment, in the form of an LC oscillator with stress sensors and differential temperature sensors, i.e. a stress measurement via a differential voltage measurement. In accordance with embodiments, FIGS. 11a and 11b each shows a schematic illustration of a stress compensated oscillator circuitry 15 having, for example an LC oscillator 340, with stress sensors 102-1 to 102-4 and differential temperature sensors 104-1 to 104-4 on the semiconductor substrate 20 in accordance with embodiments.

The L-shaped resistors 102-1, 102-3 (at +/−45° in FIG. 11a) provide together with vertical resistors 102-2, 102-4 compensation signal V2 for the X- and Y-stress dependency:

$$V_2 = f(\sigma_{xy})$$

The L-shaped resistors 102-1, 102-3 at 0°/90° in FIG. 11b) provide together with vertical resistors 102-2, 102-4 compensation signals V1 and V2 for the X- and Y-stress dependency:

$$V_1 = f(\sigma_{xx} + \sigma_{yy})$$

$$V_2 = f(\sigma_{xx} - \sigma_{yy})$$

$$V_1 + V_2 = f(\sigma_{xx} + \sigma_{yy} + \sigma_{xx} - \sigma_{yy}) = f(\sigma_{xx})$$

$$V_1 - V_2 = f(\sigma_{xx} + \sigma_{yy} - (\sigma_{xx} - \sigma_{yy})) = f(\sigma_{yy})$$

Thus different stress compensation signals for the X and Y direction are available to compensate stress effects in the (LC) oscillator 360. These stress effects correlates with mechanical bending effects of the chip and are mainly responsible for lifetime shifts or package effects.

The layout arrangement of the LC oscillator 340 of FIGS. 11a and 11b comprises symmetrically surrounding stress sensors 102-1 to 102-4 for determining the stress average and temperature average and if possible, showing no reaction to stress gradients. The symmetrically arranged temperature sensors 104-1 to 104-4 are arranged for determining the temperature without temperature gradients via the average. Moreover, the temperature sensors are radially arranged, wherein a temperature difference measurement can be conducted between symmetrically arranged temperature sensors for determining temperature gradients. Temperature gradients (e.g. caused by power in the coil) which can, for example, slightly change the position or perimeter of coils on the die or the position may be influenced by gradient caused stress effects.

In the following, a summary of different aspects of the different embodiments described above with respect to FIGS. 1-11b is provided for facilitating the understanding of the implementation of an on-chip oscillator with stress compensation to reduce package and life-time drift.

In accordance with embodiments, the stress compensated oscillator circuitry uses digital values derived from stress sensor to change the digital input of a fractional divider.

In accordance with embodiments, the stress compensated oscillator circuitry uses the correlation between global X- and Y-direction stress effects of die to local X- and Y-stress effects.

In accordance with embodiments, a combination of frequency determining components with different stress components is performed so that the different stress components cancel. For example, a first resistive element (arrangement like L-shape) with positive stress coefficient (i.e. a lateral n diffusion) and a second resistive element (arrangement like L-shape) with negative stress coefficient (e.g. a vertical n diffusion) is used for the sensor elements of the sensor arrangement 100.

In accordance with embodiments, a stress sensor (the stress sensor arrangement 100 with a plurality of sensor elements) is used, wherein the resulting stress signals (sensor output signals as sensor) "correlate" to the undesired influence parameter of the oscillator circuitry and the stress signals are used for stress compensation, i.e. are used by the processing arrangement 200 for determining the control signal scontrol. For example, the stress sensor provides a (σXX+σYY) stress dependent signal (dependent on an addition of the normal stress components) and a (σXX−σYY) stress dependent signal (dependent on a difference of the normal stress components) to determine different correction signals (different control signals scontrol) for the x- and y-direction in the semiconductor substrate (the sensor die). In this connection it is pointed to the fact that, a long resistor parallel to a trench has another stress influence than particular to this trench.

In accordance with embodiments, a stress compensated RC relaxation oscillator is used which controls an LC oscillator in a (fractional) PLL loop.

In accordance with embodiments, a differential temperature sensor is used to determine stress effects especially in LC oscillators (in addition to stress compensation or alone) in order to compensate thermal-gradient-induced stress effects.

In addition or alternatively, some stress components can be measured on top with differential temperature sensors.

A constant current reference or a stress dependent bias current may be built by adding or subtracting two different temperature-constant (or with bandgap-defined temperature coefficient) current sources with different mechanical stress coefficients. This may done by using two different resistor types in the current sources and bandgap-based replica circuits.

In accordance with embodiments, a 45° to wafer flat and lateral L-shape re-diffusion or n-well resistors with a positive piezo-resistive effect of σxx+σyy=−24%/GPa (sum) and σxy=+155.6%/GPa are used in combination with vertical n-diffusion or n-well resistors with σxx+σyy=+52%/GPa (sum). By that different (X and Y) stress dependent correction signals can be derived. This correction signals can be analog voltages or currents or resistors or digital correction signals derived from a stress sensor via an ADC.

In accordance with embodiments, a 0°/90° to wafer flat and lateral L-shape n-diffusion or n-well resistors with a positive piezo-resistive effect of σxx+σyy=−24%/GPa (sum) and σxx−σyy=+6.8%/GPa are used in combination with vertical n-diffusion or n-well resistors with σxx+σyy=+52%/GPa (sum). By that different (X and Y) stress dependent correction signals can be derived. This correction signals can be analog voltages or currents or resistors or digital correction signals derived from a stress sensor via an ADC.

The embodiments described above with respect to FIGS. 1-11b are advantageous in that the accordingly implemented stress compensated oscillator circuitry 10 shows 5 to 10 times smaller packaging shifts than comparable oscillator circuitries of the prior art. Moreover, a low cost and low drift on-chip solution with much lower lifetime shifts and higher stability can be provided. Moreover, soldering and process changes in packaging or humidity changes in package do not lead to frequency changes. Only one-point adjustment for the oscillator output signal sosc with the oscillator output frequency fosc at any temperature is required. For a higher accuracy, also a two-point adjustment is possible. However, no further two-point adjustments for stress compensation is required. Moreover, fixed stress coefficients can be used for one specific design of the integrated circuit. The oscillator circuitry provides also a much faster settle time after power-on (e.g. 10 times faster). Based on the concept, crystal oscillator circuits or MEMS oscillator circuits can be removed from the integrated circuit for many applications, TPM-sensors (TPM-tire pressure monitor), microprocessors (μPs) without crystal or MEMS oscillator, WLAN products and sensor networks.

Although the embodiments and its advantages have been described in detail, it should be understood that various changes, substitutions and alterations can be made herein without departing from the spirit and scope of the invention as defined by the appended claims.

Moreover, the scope of the present application is not limited to the particular embodiments of the process, machine, manufacturer, composition of matters, means, method and steps described in the specification. As one of ordinary skill in the art will readily appreciate from the disclosure of the present application, processes, machines, manufacture, compositions of matter, means, methods, or steps presently existing or later to be developed that perform substantially the same function or achieve substantially the same result as the corresponding embodiments described herein may be utilized according to the embodiments. Accordingly, the appended claims are intended to include within their scope such processes, machines, manufacture, compositions of matter, means, and methods of steps.

The invention claimed is:

1. Stress compensated oscillator circuitry, comprising:
a sensor arrangement for providing a sensor output signal, the sensor arrangement comprising a stress-sensitive sensor element and a stress-insensitive resistive element, wherein the sensor output signal is based on an instantaneous stress or strain component in a semiconductor substrate,
a processing arrangement for processing the sensor output signal and providing a control signal depending on the instantaneous stress or strain component in the semiconductor substrate, and
an oscillator arrangement for providing an oscillator output signal having an oscillator frequency based on the control signal,
wherein the stress-sensitive sensor element provides a stress dependent sensor signal having a stress component dependency with respect to at least one of a sum of normal stress components, a difference of the normal stress components, or a shear stress component in the semiconductor substrate, wherein the stress-insensitive resistive element provides a stress-insensitive signal, and wherein the sensor output signal is based on a combination of the stress dependent sensor signal and the stress-insensitive signal; and
wherein the control signal controls the oscillator output signal, and wherein the control signal reduces an influence of the instantaneous stress or strain component in the semiconductor substrate onto the oscillator output signal, so that the stress compensated oscillator circuitry provides a stress compensated oscillator output signal.

2. The stress compensated oscillator circuitry according to claim 1, wherein the stress-sensitive sensor element comprises a piezo-sensitive sensor element, and wherein the stress-insensitive resistive element comprises a Poly-Si resistive element or a metal resistive element.

3. The stress compensated oscillator circuitry according to claim 2, wherein the stress-insensitive resistive element has a low stress coefficient, with ΔR(σ)<5 or 2%/GPa.

4. The stress compensated oscillator circuitry according to claim 1, wherein the sensor output signal is based on a comparison of the stress dependent sensor signal and the stress-insensitive signal.

5. The stress compensated oscillator circuitry according to claim 1, wherein the sensor arrangement, the processing arrangement, and the oscillator arrangement are integrated on a same semiconductor substrate.

6. The stress compensated oscillator circuitry according to claim 1, wherein the sensor arrangement comprises a plurality of stress-sensitive sensor elements, each of the plurality of stress-sensitive sensor elements sensing the instantaneous stress or strain component in the semiconductor substrate.

7. The stress compensated oscillator circuitry according to claim 6, wherein the plurality of stress-sensitive sensor elements are configured to sense the instantaneous stress and strain components which are orthogonal to each other and in plane with respect to a surface of the semiconductor substrate.

8. The stress compensated oscillator circuitry according to claim 6, wherein the plurality of stress-sensitive sensor elements are piezo-sensitive sensor elements.

9. The stress compensated oscillator circuitry according to claim 8, wherein the plurality of stress-sensitive sensor elements comprises lateral piezo-sensitive sensor elements which extend lateral in the semiconductor substrate with respect to a surface of the semiconductor substrate and further comprises vertical piezo-sensitive sensor elements, which extend vertical in the semiconductor substrate with respect to the surface of the semiconductor substrate.

10. The stress compensated oscillator circuitry according to claim 9, wherein the lateral piezo-sensitive sensor elements are L-shaped sensor elements and are spatially distributed across the surface of the semiconductor substrate.

11. The stress compensated oscillator circuitry according to claim 10, wherein the L-shaped sensor elements are piezo-sensitive diffusion resistors.

12. The stress compensated oscillator circuitry according to claim 8, wherein the piezo-sensitive sensor elements comprises a first number of piezo-sensitive sensor elements having a first stress coefficient and comprises a second number of piezo-sensitive sensor elements having a second stress coefficient, wherein the first and second stress coefficients are different.

13. The stress compensated oscillator circuitry according to claim 12, wherein the first number of piezo-sensitive sensor elements provides a first stress dependent sensor signal having a first stress component dependency and the second number of piezo-sensitive sensor elements providing a second stress dependent sensor signal having a second stress component dependency, wherein the first stress dependent sensor signal has a stress component dependency with respect to the sum of the normal stress components in the semiconductor substrate, and wherein the second number of piezo-sensitive sensor elements provide the second stress dependent sensor signal with a stress component dependency with respect to the difference of the normal stress components in the semiconductor substrate.

14. The stress compensated oscillator circuitry according to claim 1, wherein the sensor arrangement further comprises a temperature sensor element on or in the semiconductor substrate for providing a temperature sensor signal with respect to an instantaneous temperature of the semiconductor substrate.

15. The stress compensated oscillator circuitry according to claim 14, wherein the sensor arrangement comprises a plurality of temperature sensor elements which are spatially distributed over a surface of the semiconductor substrate.

16. The stress compensated oscillator circuitry according to claim 15, wherein the plurality of temperature sensor elements form a differential temperature sensor arrangement.

17. The stress compensated oscillator circuitry according to claim 1, wherein the processing arrangement is configured to perform a feed-forward sensor output signal processing for providing the control signal as a stress compensation signal to the oscillator arrangement.

18. The stress compensated oscillator circuitry according to claim 17, wherein the processing arrangement is configured to use a look-up table or to calculate a polynomial function or piece-wise linear function based on the sensor output signal in order to determine the control signal.

19. The stress compensated oscillator circuitry according to claim 1, wherein the processing arrangement is configured to process the sensor output signal in order to provide the control signal which is a combination of a plurality of partial control signals, wherein each of the plurality of partial control signals controls the oscillator frequency of the oscillator output signal and reduces an influence of a different instantaneous component in the semiconductor substrate onto the oscillator frequency of the oscillator output signal.

20. The stress compensated oscillator circuitry according to claim 1, wherein the processing arrangement is configured to process the sensor output signal in order to provide the control signal, wherein the control signal comprises a first partial control signal and a second partial control signal to provide a first partial correction signal and a second partial correction signal for different stress component dependencies of the oscillator arrangement in the semiconductor substrate.

21. The stress compensated oscillator circuitry according to claim 15, wherein the processing arrangement is configured to process sensor output signals, including the sensor output signal, from the plurality of temperature sensor elements for determining a temperature dependent stress effect induced to a temperature gradient in the semiconductor substrate, and to provide the control signal which reduces an influence of the instantaneous temperature or temperature gradient in the semiconductor substrate onto the oscillator frequency of the oscillator output signal so that thermal-gradient-induced stress effects to the oscillator frequency of the oscillator output signal are reduced.

22. The stress compensated oscillator circuitry according to claim 1, wherein the oscillator arrangement comprises an oscillator in a fractional phase locked loop (PLL) loop, wherein the fractional PLL loop has a fractional divider, wherein the processing arrangement is configured to process the sensor output signal and to provide the control signal, wherein the control signal controls the fractional divider of the fractional PLL loop of the oscillator arrangement in order to reduce the influence of the instantaneous stress or strain component in the semiconductor substrate on the oscillator frequency of the oscillator output signal.

23. The stress compensated oscillator circuitry according to claim 1, wherein the oscillator arrangement comprises a directly stress compensated LC oscillator or a stress compensated oscillator with a correction digital/analog converter (DAC) for bias current, switchable capacitances, and/or voltage-dependent capacitances.

24. The stress compensated oscillator circuitry according to claim 1, wherein the oscillator arrangement comprises a relaxation oscillator with at least one of:

a stress-compensated integrator current,
stress-compensated reference voltages, or
stress-compensated integrated capacitances.

25. The stress compensated oscillator circuitry according to claim 24, wherein the processing arrangement is configured to provide a plurality of partial control signals to adjust a combination of at least two of:
the stress-compensated integrator current,
the stress-compensated reference voltages, or
the stress-compensated integrated capacitances,
wherein the combination is adjusted in order to reduce the influence of the instantaneous stress or strain component in the semiconductor substrate onto the oscillator frequency of the oscillator output signal.

26. Integrated circuit comprising:
a stress compensated oscillator circuitry according to claim 1, and
a processing circuitry for performing a processing operation based on the stress compensated oscillator output signal provided by the stress compensated oscillator circuitry.

27. The integrated circuit according to claim 26, wherein the stress compensated oscillator circuitry and the processing circuitry are integrated on a same semiconductor substrate.

28. The integrated circuit according to claim 26, wherein the processing arrangement of the stress compensated oscillator circuitry and the processing circuitry commonly share integrated hardware on the semiconductor substrate.

29. The integrated circuit according to claim 28, wherein the processing arrangement of the stress compensated oscillator circuitry and the processing circuitry commonly use analog/digital converters (ADCs), temperature sensors, voltage references, voltage supplies, and bias current supplies with defined temperature coefficients on a same semiconductor substrate.

* * * * *